(12) United States Patent  (10) Patent No.: US 12,108,647 B2
Long et al.  (45) Date of Patent: Oct. 1, 2024

(54) DISPLAY SUBSTRATE WITH LIGHT-TRANSMITTING DISPLAY REGION

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Yuanyou Qiu, Beijing (CN); Weiyun Huang, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 622 days.

(21) Appl. No.: 17/288,823

(22) PCT Filed: Jan. 23, 2020

(86) PCT No.: PCT/CN2020/073993
§ 371 (c)(1),
(2) Date: Apr. 26, 2021

(87) PCT Pub. No.: WO2021/147081
PCT Pub. Date: Jul. 29, 2021

(65) Prior Publication Data
US 2022/0310768 A1  Sep. 29, 2022

(51) Int. Cl.
*H10K 59/131* (2023.01)
*H01L 27/12* (2006.01)
(Continued)

(52) U.S. Cl.
CPC ........ *H10K 59/1315* (2023.02); *H01L 27/124* (2013.01); *H10K 59/1201* (2023.02); *H10K 59/1213* (2023.02)

(58) Field of Classification Search
CPC ........... H10K 59/1315; H10K 59/1201; H10K 59/1213; H10K 59/123; H10K 59/131;
(Continued)

(56) References Cited

U.S. PATENT DOCUMENTS 10,756,136 B1  8/2020  Ma et al.
10,910,459 B2  2/2021  Liang et al.
(Continued)

FOREIGN PATENT DOCUMENTS

CN  104599634 A  5/2015
CN  107591125 A  1/2018
(Continued)

OTHER PUBLICATIONS

The Extended European Search Report dated Jan. 3, 2023; Appln. No. 20866970.5.
(Continued)

*Primary Examiner* — Caleb E Henry
(74) *Attorney, Agent, or Firm* — Frank Gao, Esq.

(57) ABSTRACT

A display substrate and a manufacturing method thereof are provided. The display substrate has a first side and a second side opposite to the first side, and the display substrate includes a display region, the display region includes a first display region and a second display region at least partially surrounding the first display region, the first display region allows light from the first side to be at least partially transmitted to the second side; and the display substrate further includes at least one first connection wire in both of the first display region and the second display region, the first connection wire includes a first portion in the first
(Continued)

display region and a second portion in the second display region, the first portion and the second portion are electrically connected, the first portion includes a first light-transmitting wiring layer, and the second portion includes a metal wiring layer.

18 Claims, 11 Drawing Sheets

(51) Int. Cl.
  *H10K 59/12* (2023.01)
  *H10K 59/121* (2023.01)
(58) Field of Classification Search
  CPC .... H10K 59/121; H10K 50/11; H10K 50/813; H10K 50/82; H10K 59/1216; H10K 59/124; H10K 59/60; H10K 59/65; H10K 77/10; H10K 71/00; H01L 27/124; H01L 27/1255
  See application file for complete search history.

(56) References Cited

U.S. PATENT DOCUMENTS

| | | | |
|---|---|---|---|
| 2002/0121639 A1* | 9/2002 | So | H01L 27/1288 257/E29.147 |
| 2011/0193855 A1 | 8/2011 | Han | |
| 2013/0087770 A1 | 4/2013 | Son et al. | |
| 2013/0207099 A1 | 8/2013 | Shu et al. | |
| 2018/0089485 A1* | 3/2018 | Bok | G06F 1/1684 |
| 2019/0123066 A1 | 4/2019 | Zhan et al. | |
| 2019/0393286 A1 | 12/2019 | Ding et al. | |
| 2020/0013986 A1* | 1/2020 | Li | G09G 3/3208 |
| 2020/0176696 A1* | 6/2020 | Dai | H10K 59/131 |
| 2021/0066409 A1 | 3/2021 | Fan | |
| 2021/0074778 A1* | 3/2021 | Li | G02F 1/16756 |
| 2021/0327958 A1 | 10/2021 | Li et al. | |
| 2022/0209148 A1 | 6/2022 | Park et al. | |

FOREIGN PATENT DOCUMENTS

| | | |
|---|---|---|
| CN | 107610635 A | 1/2018 |
| CN | 208173203 U | 11/2018 |
| CN | 109064904 A | 12/2018 |
| CN | 109272873 A | 1/2019 |
| CN | 109585519 A | 4/2019 |
| CN | 109817672 A | 5/2019 |
| CN | 109981855 A | 7/2019 |
| CN | 110047846 A | 7/2019 |
| CN | 110061038 A | 7/2019 |
| CN | 110189639 A | 8/2019 |
| CN | 110232892 A | 9/2019 |
| CN | 110265458 A | 9/2019 |
| CN | 110491918 A | 11/2019 |
| CN | 110492018 A | 11/2019 |
| CN | 110504289 A | 11/2019 |
| CN | 209787228 U | 12/2019 |
| CN | 110675744 A | 1/2020 |
| CN | 110718575 A | 1/2020 |
| CN | 111326560 A | 6/2020 |
| JP | 2010230797 A | 10/2010 |
| JP | 2018085114 A | 5/2018 |
| WO | 2012/101397 A2 | 8/2012 |

OTHER PUBLICATIONS

USPTO NFOA dated Mar. 2, 2023 in connection with U.S. Appl. No. 17/297,641.
The Second Chinese Office Action dated Oct. 17, 2022; Appln. No. 202080000101.2.
Japanese Office Action dated Feb. 13, 2024; Appln. No. 2022-502521.
The Second Japanese Office Action dated Jun. 10, 2024; Appln. 2022-502521.

* cited by examiner

DISPLAY SUBSTRATE WITH LIGHT-TRANSMITTING DISPLAY REGION

TECHNICAL FIELD

Embodiments of the present disclosure relate to a display substrate and a manufacturing method thereof.

BACKGROUND

At present, display screens used in electronic devices are developing towards larger screens and full screens, so that users can have a better visual experience. Taking electronic products such as mobile phones and tablet computers as examples, these electronic devices need to incorporate components such as cameras and light sensors, and these components usually occupy the display regions of the display screens, which makes it difficult for the display screens to achieve a full-screen design.

SUMMARY

At least one embodiment of the present disclosure provides a display substrate, the display substrate has a first side for display and a second side opposite to the first side, and the display substrate comprises a display region, in which the display region comprises a first display region and a second display region at least partially surrounding the first display region, and the first display region allows light from the first side to be at least partially transmitted to the second side; and the display substrate further comprises at least one first connection wire in both of the first display region and the second display region, in which the first connection wire comprises a first portion in the first display region and a second portion in the second display region, the first portion and the second portion are electrically connected with each other, the first portion comprises a first light-transmitting wiring layer, and the second portion comprises a metal wiring layer.

For example, in the display substrate provided by at least one embodiment of the present disclosure, the first display region comprises a plurality of first sub-pixels arranged in an array, each of the first sub-pixels comprises a first light-emitting device, and the at least one first connection wire comprises a plurality of first connection wires; the second display region comprises a plurality of first pixel circuits, and the plurality of first pixel circuits are respectively electrically connected with first light-emitting devices of the plurality of first sub-pixels through the plurality of first connection wires, so as to drive the first light-emitting devices of the plurality of first sub-pixels.

For example, in the display substrate provided by at least one embodiment of the present disclosure, the second portion further comprises a second light-transmitting wiring layer stacked with the metal wiring layer, and the second light-transmitting wiring layer and the first light-transmitting wiring layer are arranged in a same layer and are integrally connected with each other.

For example, in the display substrate provided by at least one embodiment of the present disclosure, the second portion further comprises an anti-oxidation protection layer stacked with the metal wiring layer, the display substrate comprises a base substrate, the second light-transmitting wiring layer is on the base substrate, the metal wiring layer is on a side of the second light-transmitting wiring layer away from the base substrate, and the anti-oxidation protection layer is on a side of the metal wiring layer away from the base substrate.

For example, in the display substrate provided by at least one embodiment of the present disclosure, a material of the metal wiring layer comprises Ag, Al, Mo or Ti; and a material of the anti-oxidation protection layer comprises a transparent oxide.

For example, in the display substrate provided by at least one embodiment of the present disclosure, the first light-emitting device comprises a first anode structure, a first cathode structure, and a first light-emitting layer between the first anode structure and the first cathode structure; and the first portion is electrically connected with the first anode structure through a via.

For example, in the display substrate provided by at least one embodiment of the present disclosure, the second display region further comprises a plurality of second sub-pixels, each of the second sub-pixels comprises a second light-emitting device and a second pixel circuit electrically connected with the second light-emitting device, the second pixel circuit is configured to drive the second light-emitting device, and in the second display region, a plurality of second pixel circuits are arranged in a first array.

For example, in the display substrate provided by at least one embodiment of the present disclosure, in the second display region, the plurality of first pixel circuits are arranged in the first array, and the plurality of first pixel circuits and the plurality of second pixel circuits are arranged in a second array.

For example, in the display substrate provided by at least one embodiment of the present disclosure, the second light-emitting device comprises a second anode structure, a second cathode structure, and a second light-emitting layer between the second anode structure and the second cathode structure, and the second anode structure is electrically connected with the second pixel circuit through a via.

For example, in the display substrate provided by at least one embodiment of the present disclosure, the display region further comprises a third display region at least partially surrounding the second display region, the third display region comprises a plurality of third sub-pixels arranged in an array, each of the third sub-pixels comprises a third light-emitting device and a third pixel circuit electrically connected with the third light-emitting device, and the third pixel circuit is configured to drive the third light-emitting device, and the third light-emitting device comprises a third anode structure, a third cathode structure, and a third light-emitting layer between the third anode structure and the third cathode structure, and the third anode structure is electrically connected with the third pixel circuit through a via.

For example, in the display substrate provided by at least one embodiment of the present disclosure, the display substrate comprises a base substrate, the first display region further comprises a transparent support layer on the base substrate, and the first light-emitting device is on a side of the transparent support layer away from the base substrate.

For example, in the display substrate provided by at least one embodiment of the present disclosure, the first pixel circuit comprises a thin film transistor and a storage capacitor, the thin film transistor comprises an active layer, a gate electrode, and source and drain electrodes; the storage capacitor comprises a first capacitor plate and a second capacitor plate, the active layer is on the base substrate, and a first gate insulating layer is arranged on a side of the active layer away from the base substrate, the gate electrode and the first capacitor plate are arranged in a same layer and on a side of the first gate insulating layer away from the base substrate, and a second gate insulating layer is arranged on a side of the gate electrode and the first capacitor plate away from the base substrate, the second capacitor plate is arranged on a side of the second gate insulating layer away from the base substrate, and an interlayer insulating layer is arranged on a side of the second capacitor plate away from the base substrate, the source and drain electrodes are arranged on a side of the interlayer insulating layer away from the base substrate, and are electrically connected with the active layer through vias passing through the first gate insulating layer, the second gate insulating layer, and the interlayer insulating layer, and a planarization layer is arranged on a side of the source and drain electrodes away from the base substrate; and the transparent support layer is arranged in a same layer as at least one of the first gate insulating layer, the second gate insulating layer, the interlayer insulating layer, and the planarization layer.

For example, the display substrate provided by at least one embodiment of the present disclosure further comprises a sensor, in which the sensor is arranged on the second side of the display substrate, and an orthographic projection of the sensor on the base substrate at least partially overlaps with the first display region, and the sensor is configured to receive light from the first side.

At least one embodiment of the present disclosure provides a manufacturing method of a display substrate, the display substrate has a first side for display and a second side opposite to the first side, and the manufacturing method comprises: forming a display region, in which the display region comprises a first display region and a second display region at least partially surrounding the first display region, and the first display region allows light from the first side to be at least partially transmitted to the second side; and forming at least one first connection wire in both of the first display region and the second display region, in which the first connection wire comprises a first portion in the first display region and a second portion in the second display region, the first portion and the second portion are electrically connected with each other, and the first portion comprises a first light-transmitting wiring layer, and the second portion comprises a metal wiring layer.

For example, in the manufacturing method of a display substrate provided by at least one embodiment of the present disclosure, the forming the display region further comprises: forming a plurality of first sub-pixels arranged in an array in the first display region, in which each of the first sub-pixels comprises a first light-emitting device, and forming a plurality of first pixel circuits in the second display region, in which the at least one first connection wire comprises a plurality of first connection wires; and the plurality of first pixel circuits are respectively electrically connected with the first light-emitting devices of the plurality of first sub-pixels through the plurality of first connection wires, so as to drive the first light-emitting devices of the plurality of first sub-pixels.

For example, in the manufacturing method of a display substrate provided by at least one embodiment of the present disclosure, the forming the second portion of the first connection wire further comprises: forming a second light-transmitting wiring layer stacked with the metal wiring, wherein the second light-transmitting wiring layer and the first light-transmitting wiring layer are formed in a same layer and are integrally connected with each other.

For example, the manufacturing method of a display substrate provided by at least one embodiment of the present disclosure further comprises: providing a base substrate, in which the forming the second portion of the first connection wire further comprises: forming an anti-oxidation protection layer stacked with the metal wiring, in which the second light-transmitting wiring layer is formed on the base substrate, the metal wiring layer is formed on a side of the second light-transmitting wiring layer away from the base substrate, and the anti-oxidation protection layer is formed on a side of the metal wiring layer away from the base substrate.

For example, in the manufacturing method of a display substrate provided by at least one embodiment of the present disclosure, the forming the first connection wire comprises: depositing a light-transmitting wiring material layer, a metal wiring material layer, and a conductive protective material layer sequentially in both of the first display region and the second display region through a mask; and etching the metal wiring material layer and the conductive protective material layer in the first display region by a dry etching method.

For example, in the manufacturing method of a display substrate provided by at least one embodiment of the present disclosure, the forming the first connection wire comprises: depositing a light-transmitting wiring material layer, a metal wiring material layer, and a conductive protective material layer sequentially in both of the first display region and the second display region through a mask; etching the metal wiring material layer and the conductive protective material layer in the first display region by a wet etching method; and depositing a transparent wiring material layer in both of the first display region and the second display region through the mask.

For example, in the manufacturing method of a display substrate provided by at least one embodiment of the present disclosure, the forming the first pixel circuit comprises forming a thin film transistor and a storage capacitor, the thin film transistor comprises an active layer, a gate electrode, and source and drain electrodes; the storage capacitor comprises a first capacitor plate and a second capacitor plate, in which the active layer is formed on the base substrate, a first gate insulating layer is formed on a side of the active layer away from the base substrate, the gate electrode and the first capacitor plate are formed in a same layer and on a side of the first gate insulating layer away from the base substrate, a second gate insulating layer is formed on a side of the gate electrode and the first capacitor plate away from the base substrate, the second capacitor plate is formed on a side of the second gate insulating layer away from the base substrate, an interlayer insulating layer is formed on a side of the second capacitor plate away from the base substrate, the source and drain electrodes are formed on a side of the interlayer insulating layer away from the base substrate, and are electrically connected with the active layer through vias passing through the first gate insulating layer, the second gate insulating layer, and the interlayer insulating layer, and a planarization layer is formed on a side of the source and drain electrodes away from the base substrate; the forming the first display region further comprises: forming a transparent support layer between the base substrate and the first light-emitting device, wherein the transparent support layer is formed in a same layer as at least one of the first gate insulating layer, the second gate insulating layer, the interlayer insulating layer, and the planarization layer.

For example, the manufacturing method of a display substrate provided by at least one embodiment of the present disclosure further comprises: providing a sensor, and connecting the sensor on the second side of the display substrate, wherein an orthographic projection of the sensor on the base substrate at least partially overlaps with the first display region, and is configured to receive light from the first side.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

In order to realize a full-screen design of a display screen, in some embodiments, a part of a display region used for installing a sensor (for example, an image sensor, or an infrared sensor) and other components can be designed as a light-transmitting display region, so that the light-transmitting display region can provide convenience for installing the sensor and other components while realizing the display function.

Figure 1A:
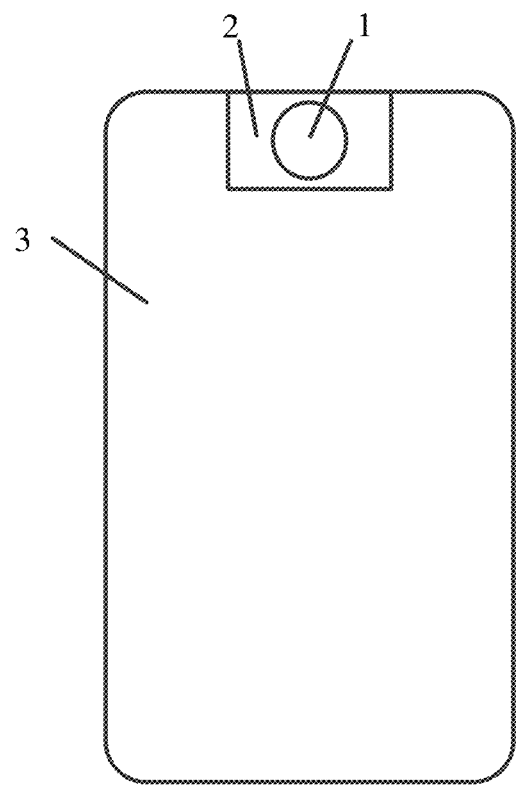
FIG. 1A is a plane schematic diagram of a display substrate.
Figure 1B:
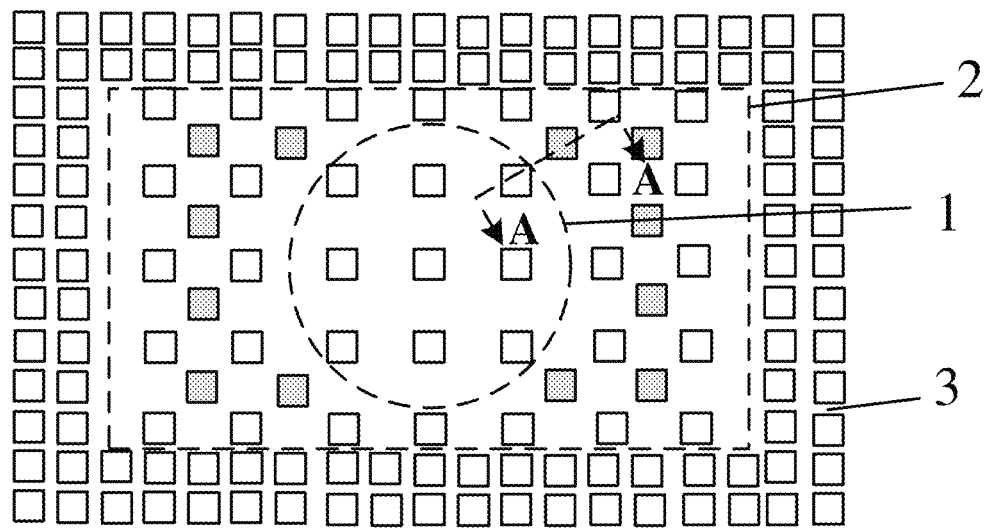
FIG. 1B is a partial enlarged schematic diagram of a display substrate.
Figure 2:
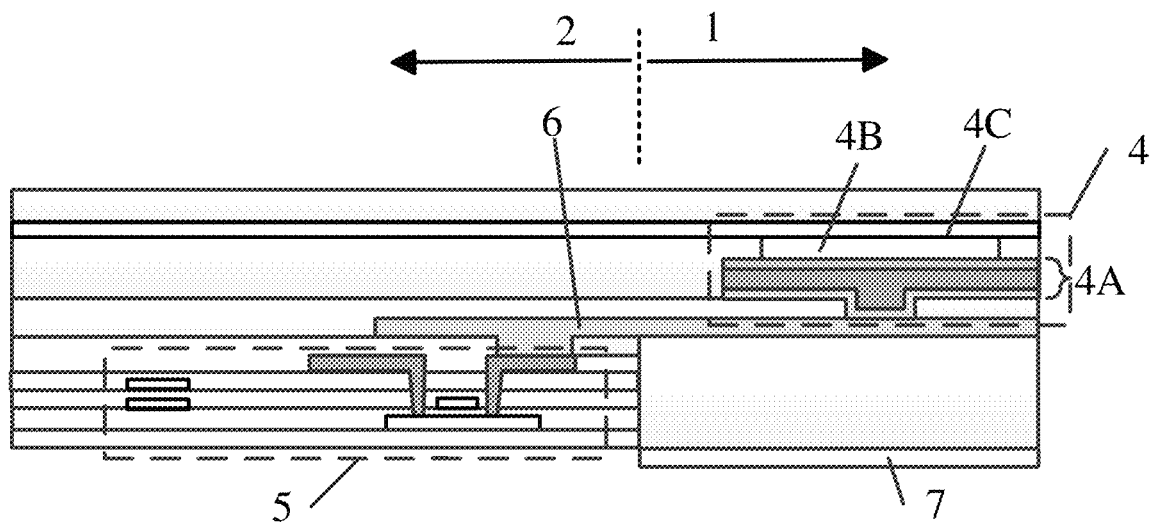
FIG. 2 is a cross-sectional schematic diagram of the display substrate in FIG. 1B along a line A-A.

For example, FIG. 1A is a plane schematic diagram of a display substrate, FIG. 1B is a partial enlarged schematic diagram of a display substrate, and FIG. 2 is a cross-sectional schematic diagram of the display substrate in FIG. 1B along a line A-A. As shown in FIG. 1A, FIG. 1B and FIG. 2, the display region of the display substrate includes a light-transmitting display region 1, a peripheral display region 2 and a main display region 3.

For example, the main display region 3 is a main display region with a higher resolution (PPI, Pixel Per Inch), that is, sub-pixels for display with a higher density are arranged in the main display region 3. Each of the sub-pixels includes a light-emitting device and a pixel circuit that drives the light-emitting device. The light-transmitting display region 1 can allow light incident from a display side of the display substrate to pass through the display substrate to reach a back side of the display substrate, so that the light is used for the normal operation of the sensor and other components located on the back side of the display substrate. The light-transmitting display region 1 and the peripheral display region 2 further include a plurality of sub-pixels for display. However, because the pixel circuits of the sub-pixels are usually opaque, in order to ensure the light transmittance of the light-transmitting display region 1, the pixel circuits of the sub-pixels (for example, as shown in the frames in the light-transmitting display region 1 in FIG. 1B) in the light-transmitting display region 1 can be arranged in the peripheral display region 2, as shown in the gray frames in the peripheral display region 2, so that the pixel circuits occupy a part of the space of the peripheral display region 2, and the remaining space of the peripheral display region 2 is used for arranging the sub-pixels of the peripheral display region 2, for example, each of white frames in the peripheral display region 2 represents a sub-pixel. In this case, the sub-pixels in the peripheral display region 2 (white frames in FIG. 1B) and the pixel circuits of the sub-pixels in the light-transmitting display region 1 (gray frames in FIG. 1B) are arranged in an array in the peripheral display region 2. Therefore, both the resolution of the light-transmitting display region 1 and the resolution of the peripheral display region 2 are lower than the resolution of the main display region 3, that is, the density of the sub-pixels arranged in the light-transmitting display region 1 and the density of the sub-pixels arranged in the peripheral display region 2 for display are less than the density of the sub-pixels of the main display region 3, respectively.

As shown in FIG. 2, a light-emitting device 4 of one of the sub-pixels in the light-transmitting display region 1 includes an anode 4A, a cathode 4C, and a light-emitting layer 4B located between the anode 4A and the cathode 4C, and the anode 4A is connected to the pixel circuit 5 in the peripheral display region 2 through a lead wire.

In a specific embodiment, the lead wire is a metal wire, for example, the lead wire is made of a same material as a source and drain electrode metal in the pixel circuits of the sub-pixels, or the lead wire is a transparent wire (such as an ITO wire) 6 that is electrically connected to the pixel circuit 5 in the peripheral display region 2, so that the pixel circuit 5 located in the peripheral display region 2 can be used to drive the light-emitting device 4 located in the light-transmitting display region 1. Because the transparent wire 6 has a high light transmittance, it can be ensured that the transparent display region 1 also has a high light transmittance. As a result, the component such as a sensor 7 provided on the back side of the display substrate can receive the light transmitted from the display side of the display substrate through the light-transmitting display region 1 to perform normal operation.

In the above case, the transparent wire 6 needs to extend from the pixel circuit 5 in the peripheral display region 2 to the light-emitting device 4 in the light-transmitting display region 1, thus the length of at least part of the transparent wires 6 is relatively long, for example, the length of one of the transparent wires spans a distance of more than 2 sub-pixel regions; on the other hand, compared to the materials of the source and drain electrodes, such as Ti/Al/Ti, or either one or a combination of the two of Ti/Al/Ti; or compared to other electrode materials, such as copper, molybdenum, magnesium, silver, or a combination of at least two materials, the material used for the transparent wire 6 has a relatively high resistance, and the manufacturing process of the transparent wire 6 is prone to deviations, which makes the overall resistance of the transparent wire 6 relatively large, so that the pixel circuit 5 transmits electrical signals to the sub-pixels in the light-transmitting display region 1 at a slower speed, as a result, the driving of the sub-pixels in the light-transmitting display region 1 and the driving of the sub-pixels in both of the peripheral display region 2 and the main display region 3 are not synchronized, which affects the display effect of the display region.

At least one embodiment of the present disclosure provides a display substrate and a manufacturing method thereof, the display substrate has a first side for display and a second side opposite to the first side, and the display substrate includes a display region, the display region includes a first display region and a second display region at least partially surrounding the first display region, the first display region allows light from the first side to be at least partially transmitted to the second side; the display substrate further includes at least one first connection wire in both of the first display region and the second display region, the first connection wire includes a first portion located in the first display region and a second portion located in the second display region, the first portion and the second portion are electrically connected with each other, the first portion includes a first light-transmitting wiring layer, and the second portion includes a metal wiring layer. The first connection wire in the display substrate has a relatively low resistance.

In the following, the display substrate and the manufacturing method thereof provided by some embodiments of the present disclosure are illustrated through some specific embodiments.

Figure 3:
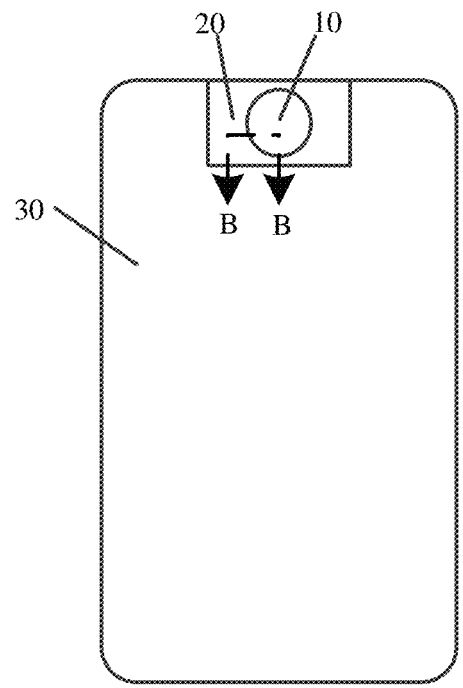
FIG. 3 is a plane schematic diagram of a display substrate provided by at least one embodiment of the present disclosure.
Figure 4:
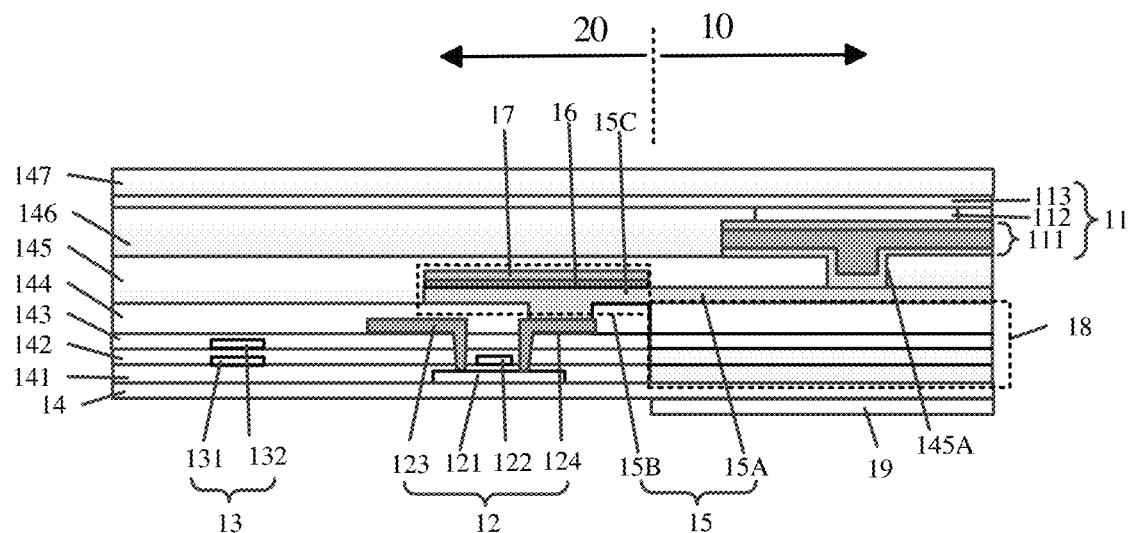
FIG. 4 is a cross-sectional schematic diagram of the display substrate in FIG. 3 along a line B-B.

At least one embodiment of the present disclosure provides a display substrate, FIG. 3 shows a plane schematic diagram of the display substrate, and FIG. 4 shows a cross-sectional schematic diagram of the display substrate in FIG. 3 along a line B-B.

As shown in FIG. 3 and FIG. 4, the display substrate includes a first side for display (shown as the upper side of the display substrate in FIG. 4, that is, the display side of the display substrate) and a second side opposite to the first side (shown as the lower side of the display substrate in FIG. 4). The display substrate includes a display region, the display region includes a first display region 10 and a second display region 20 at least partially surrounding the first display region 10, the first display region 10 allows light from the first side to be at least partially transmitted to the second side, that is, the first display region 10 is at least partially light-transmissive to facilitate the installation of an image sensor, an infrared sensor or other components.

As shown in FIG. 4, the display substrate further includes at least one first connection wire 15 in both of the first display region 10 and the second display region 20, the first connection wire 15 includes a first portion 15A located in the first display region 10 and a second portion 15B located in the second display region 20, the first portion 15A and the second portion 15B are electrically connected with each other, the first portion 15A includes a first light-transmitting wiring layer, and the second portion 15B includes a metal wiring layer.

For example, a material of the first light-transmitting wiring layer is a transparent conductive material, for example, a transparent metal oxide such as indium tin oxide (ITO), indium zinc oxide (IZO) and so on, and a material of the metal wiring layer may include a metal material such as silver (Ag), aluminum (Al), molybdenum (Mo), or titanium (Ti), or alloy materials thereof. Because the resistance of the metal wiring layer is low, the first connection wire 15 can have a lower resistance compared to a wire that only includes the light-transmitting wiring layer.

Figure 5:
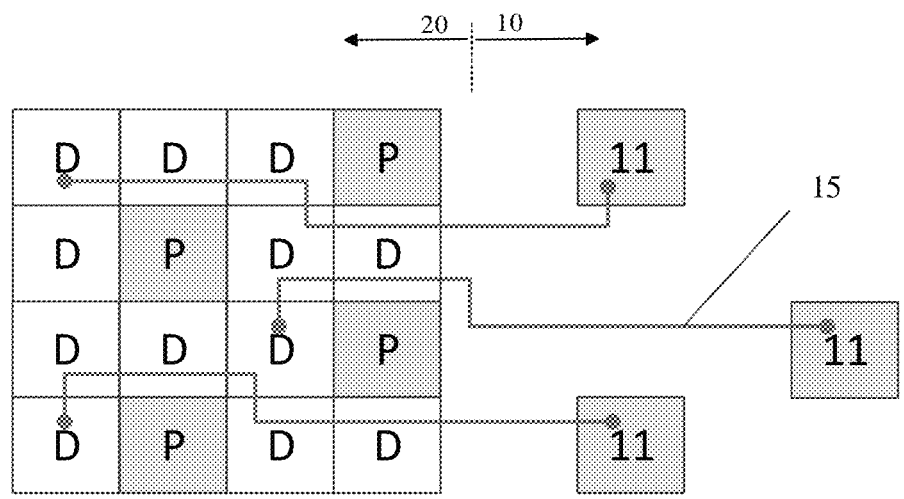
FIG. 5 is a plane schematic diagram of a first display region and a second display region in a display substrate provided by at least one embodiment of the present disclosure.

For example, FIG. 5 shows a plane schematic diagram of the first display region 10 and the second display region 20. As shown in FIG. 5, in some embodiments, the first display region 10 includes a plurality of first sub-pixels arranged in an array, each of the first sub-pixel includes a first light-emitting device 11, the display region includes a plurality of first connection wires 15, the second display region 20 includes a plurality of first pixel circuits D, the plurality of first pixel circuits D are respectively electrically connected with the first light-emitting devices 11 of the plurality of first sub-pixels through the plurality of first connection wires 15, so as to drive the first light-emitting devices 11 of the plurality of first sub-pixels.

For example, in the embodiment shown in FIG. 5, the plurality of first pixel circuits D and the first light-emitting devices 11 of the plurality of first sub-pixels are in one-to-one correspondence and are electrically connected with each other through the first connection wires 15, in this case, one first pixel circuit D is used for driving the first light-emitting device 11 of one first sub-pixel. For example, in other embodiments, one first pixel circuit D may be electrically connected with the first light-emitting devices 11 of several first sub-pixels respectively through a plurality of first connection wires 15, in this case, one first pixel circuit D is used for driving the first light-emitting devices 11 of several first sub-pixels. The embodiments of the present disclosure do not specifically limit the correspondence relationship between the first pixel circuits D and the first light-emitting devices 11 of the first sub-pixels.

For example, in some embodiments, as shown in FIG. 4, the first portion 15A of the first connection wire 15 includes a first light-transmitting wiring layer, the second portion 15B of the first connection wire 15 includes a metal wiring layer 16 and a second light-transmitting wiring layer 15C stacked with the metal wiring layer 16, and the second light-transmitting wiring layer 15C and the first light-transmitting wiring layer are arranged in a same layer and are integrally connected with each other, that is, the second light-transmitting wiring layer 15C and the first light-transmitting wiring layer are arranged in the same layer and are in direct contact with each other, thereby forming an integrated structure.

It should be noted that, in the embodiments of the present disclosure, "arranged in a same layer" means that two functional layers or structural layers are formed in the same layer and are formed of the same material in a hierarchical structure of the display substrate, that is, in the manufacturing process, the two functional layers or structural layers can be made of the same material layer, and the required patterns and structures can be formed by the same patterning process. One patterning process includes, for example, photoresist forming, exposing, developing, etching, and so on.

For example, in some embodiments, as shown in FIG. 4, the second portion 15B of the first connection wire 15 further includes an anti-oxidation protection layer 17 stacked with the metal wiring layer 16, and the anti-oxidation protection layer 17 can prevent the metal wiring layer 16 from oxidizing, so as to ensure that the metal wiring layer 16 maintains high conductivity; in addition, the anti-oxidation protection layer 17 can also enhance the adhesion between the metal wiring layer 16 and the insulating layer 145 formed on the metal wiring layer 16, so as to prevent poor connection between the metal wiring layer 16 and the insulating layer 145. For example, in some embodiments, the anti-oxidation protection layer 17 is made of a transparent oxide material, such as a transparent conductive oxide material such as ITO and IZO, as a result, the resistance of the first connection wire 15 is further reduced.

For example, as shown in FIG. 4, the display substrate includes a base substrate 14, the second light-transmitting wiring layer 15C is located on the base substrate 14, the metal wiring layer 16 is located on a side of the second light-transmitting wiring layer 15C away from the base substrate 14, and the anti-oxidation protection layer 17 is located on a side of the metal wiring layer 16 away from the base substrate 14. Thus, the second portion 15B of the first connection wire 15 is formed into a three-layer stacked conductive structure, and the three-layer stacked conductive structure can significantly reduce the resistance of the first connection wire 15. In a case where the plurality of first connection wires 15 are respectively used for transmitting driving signals for the plurality of first light-emitting devices 11, the above design of the first connection wires 15 can also improve the uniformity of the current flowing through the plurality of first connection wires 15, thereby improving the display effect of the display substrate.

Figure 6:
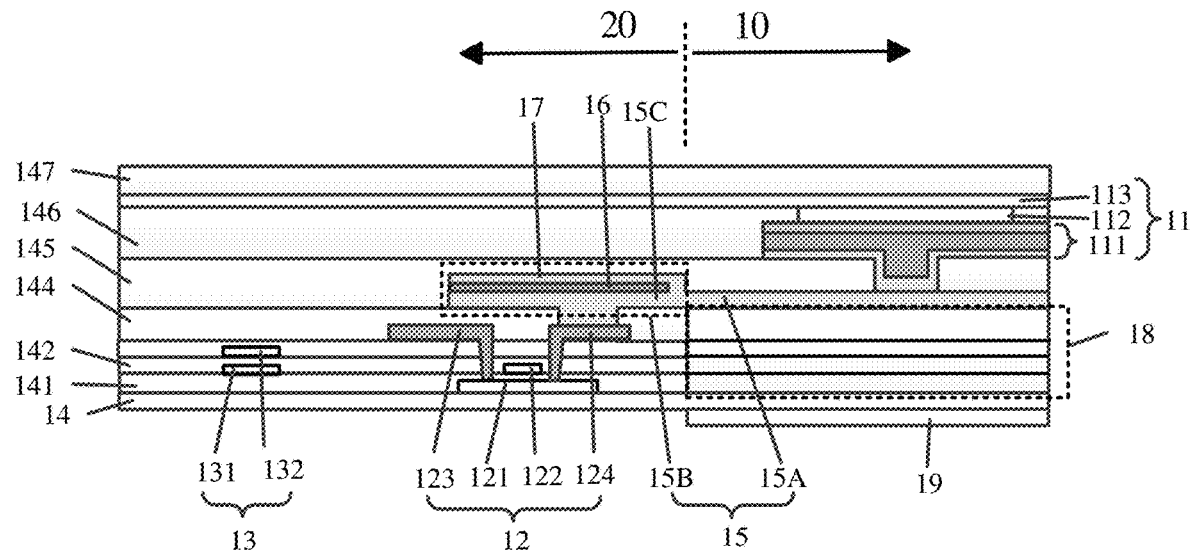
FIG. 6 is another cross-sectional schematic diagram of the display substrate in FIG. 3 along the line B-B.

For example, in the embodiment shown in FIG. 4, the second light-transmitting wiring layer 15C and the anti-oxidation protection layer 17 are spaced apart and are not in contact with each other. In other embodiments, because of the difference in the manufacturing process, as shown in FIG. 6, the second light-transmitting wiring layer 15C and the anti-oxidation protection layer 17 may be physically connected with each other, that is, in the embodiment shown in FIG. 6, the anti-oxidation protection layer 17 also covers the right side of the metal wiring layer 16, so that the anti-oxidation protection layer 17 is in physical contact with the second light-transmitting wiring layer 15C. The three-layer conductive structure provided by the embodiment can also significantly reduce the resistance of the first connection wires 15.

For example, in some embodiments, as shown in FIG. 4 and FIG. 6, the first light-emitting device 11 includes a first anode structure 111, a first cathode structure 113, and a first light-emitting layer 112 located between the first anode structure 111 and the first cathode structure 113, the first portion 15A of the first connection wire 15 is electrically connected with the first anode structure 111 through a via. For example, an insulating layer 145 is arranged on the first connection wire 15, the insulating layer 145 is provided with a via 145A in the first display region 10, and the first portion 15A of the first connection wire 15 is electrically connected with the first anode structure 111 through the via 145A in the insulating layer 145.

For example, in some embodiments, the first anode structure 111 includes a plurality of anode sub-layers, for example, FIG. 4 and FIG. 6 show three anode sub-layers. For example, the three anode sub-layers are in an ITO/Ag/ITO three-layer stacked structure. For example, the first cathode structure 113 is a structure formed on the entire surface of the display substrate, the first cathode structure 113 includes, for example, a metal material such as lithium (Li), aluminum (Al), magnesium (Mg), silver (Ag) and so on. Because the first cathode structure 113 can be formed as a very thin layer, the first cathode structure 113 has a good light transmittance.

Figure 7:
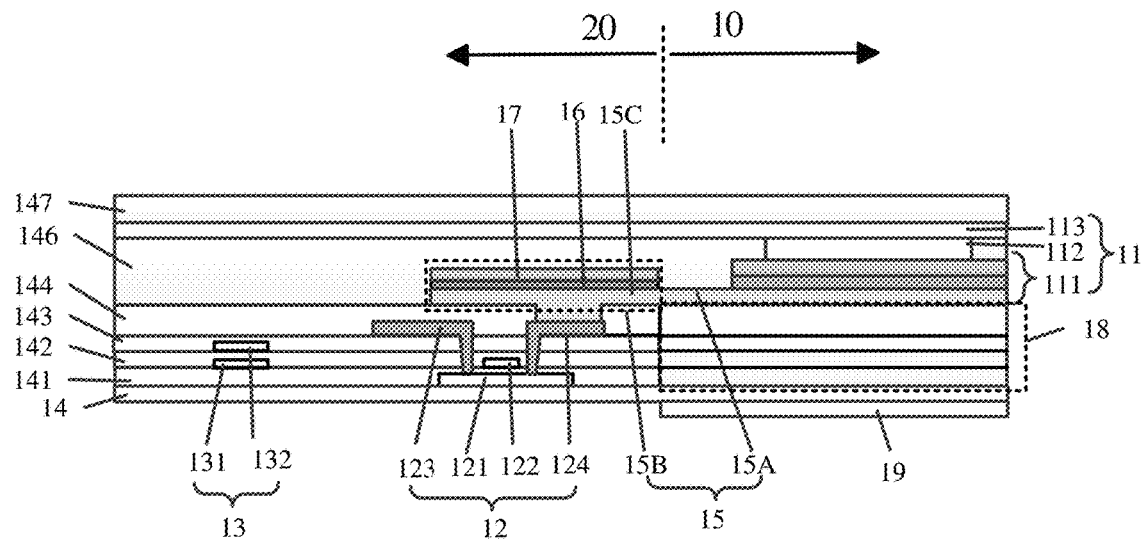
FIG. 7 is another cross-sectional schematic diagram of the display substrate in FIG. 3 along the line B-B.

For example, in other embodiments, the first connection wire 15 and the first anode structure 111 may also adopt different designs from those in FIG. 4 and FIG. 6. For example, as shown in FIG. 7, the first portion 15A of the first connection wire 15 is arranged in a same layer as a bottom anode sub-layer (for example, the ITO layer) of the plurality of anode sub-layers included in the first anode structure 111 and is integrally connected with the bottom anode sub-layer (for example, the ITO layer) of the plurality of anode sub-layers included in the first anode structure 111. In addition, the second light-transmitting wiring 15C included in the second portion 15B of the first connection wire 15 may be arranged in a same layer as the first portion 15A, and the second light-transmitting wiring 15C and the first portion 15A are integrally connected with each other, the metal wiring layer 16 included in the second portion 15B is arranged in a same layer as the intermediate anode sub-layer (for example, the Ag layer) of the plurality of anode sub-layers included in the first anode structure 111, the anti-oxidation protection layer 17 included in the second portion 15B is arranged in a same layer as a top anode sub-layer (for example, the ITO layer) of the plurality of anode sub-layers included in the first anode structure 111. Therefore, the manufacturing process of the display substrate can be simplified. For example, compared to the display substrate shown in FIG. 4 and FIG. 6, the display substrate shown in FIG. 7 can use the same patterning process to form the first connection wire 15 and the first anode structure 111 simultaneously, thus the manufacturing process of separately forming the first connection wire 1 and the manufacturing process of the insulating layer 145 are reduced.

Figure 8:
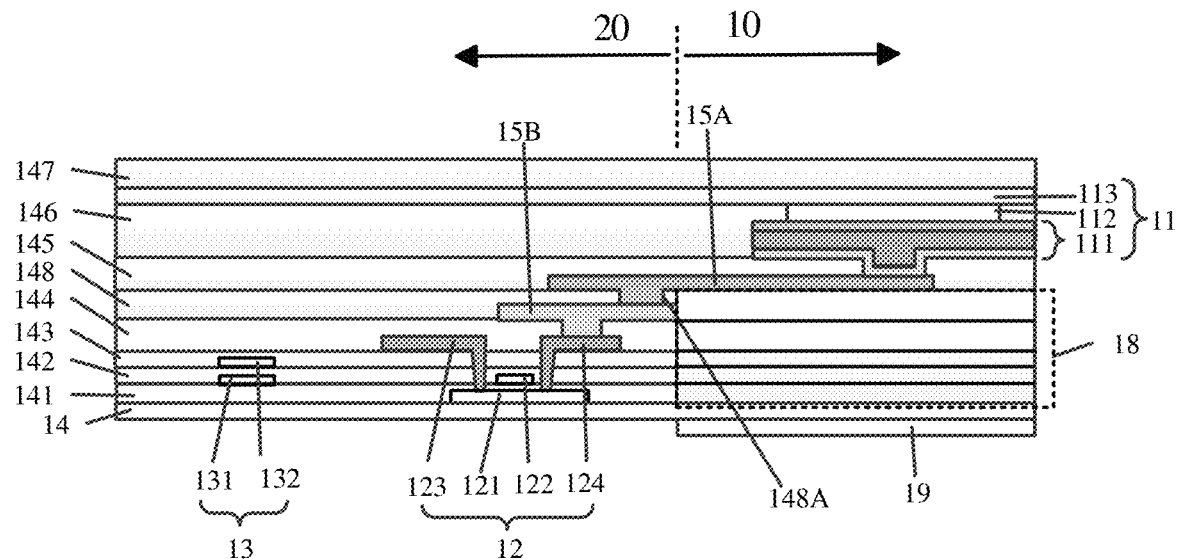
FIG. 8 is another cross-sectional schematic diagram of the display substrate in FIG. 3 along the line B-B.

For example, in some other embodiments, the first connection wire 15 may also adopt a different design from those shown in FIG. 4, FIG. 6 and FIG. 7. For example, as shown in FIG. 8, the first portion 15A of the first connection wire is a first light-transmitting wiring layer, the second portion 15B is a metal wiring layer, and the first portion 15A and the second portion 15B are electrically connected through a via. For example, an insulating layer 148 is provided on the second portion 15B, the insulating layer 148 is provided with a via 148A in the second display region 20, and the first portion 15A and the second portion 15B are electrically connected through the via 148A in the insulating layer 148.

Figure 9:
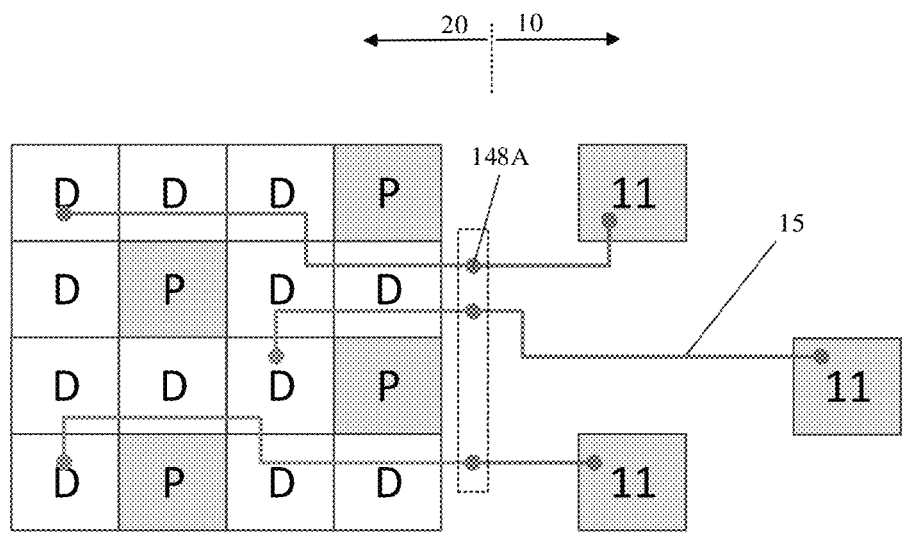
FIG. 9 is another plane schematic diagram of a first display region and a second display region in a display substrate provided by at least one embodiment of the present disclosure.

For example, FIG. 9 shows a plane schematic diagram of the first display region 10 and the second display region 20 in the above case. For example, as shown in FIG. 9, the second display region 20 is provided with a via region (the region enclosed by a dashed line frame) at a position close to the first display region 10. The first portions 15A and the second portions 15B of the plurality of first connection wires 15 may be electrically connected with each other through the plurality of vias 148A provided in the via region. In the embodiment, through the design of the metal wiring layer of the second portion 15B, the first connection wires 15 can still have a lower resistance.

For example, in some embodiments, as shown in FIG. 5, the second display region 20 further includes a plurality of second sub-pixels P, each of the second sub-pixels P includes a second light-emitting device and a second pixel circuit that is electrically connected with the second light-emitting device, the second pixel circuit is configured to drive the second light-emitting device; in the second display region 20, the plurality of second pixel circuits are arranged in a first array, that is, the array arranged by the gray frames in FIG. 5.

For example, in some embodiments, in the second display region 20, the plurality of first pixel circuits D are distributed in the first array, and the plurality of first pixel circuits D and the plurality of second pixel circuits are arranged to form a second array, that is, the array arranged by both of the gray frames and the white frames in FIG. 5.

Figure 10:
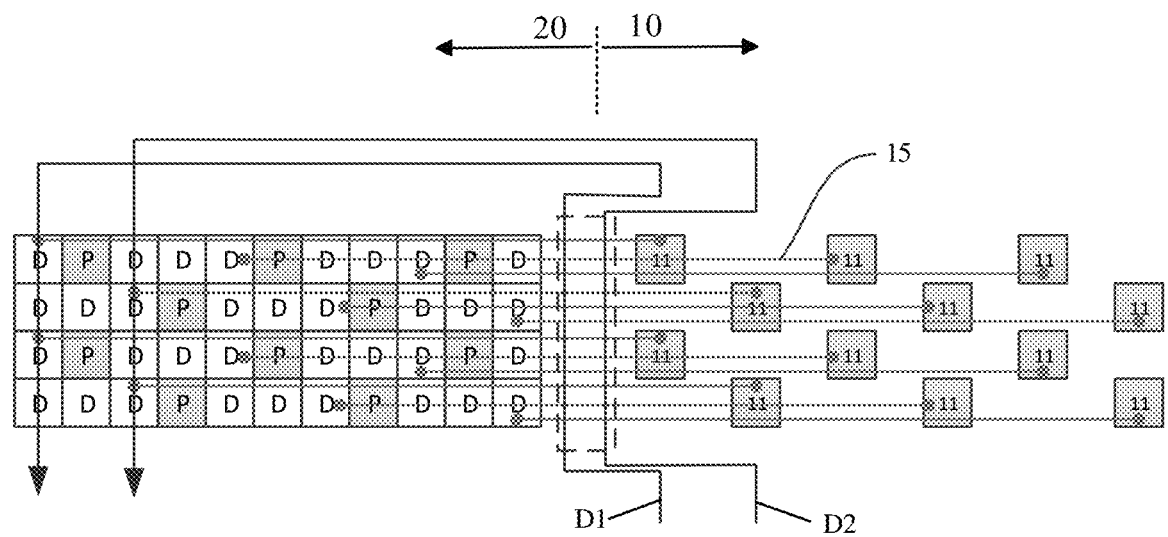
FIG. 10 is still another plane schematic diagram of a first display region and a second display region in a display substrate provided by at least one embodiment of the present disclosure.

For example, FIG. 10 shows another plane schematic diagram of the first display region 10 and the second display region 20. As shown in FIG. 10, in some embodiments, the first connection wire 15 may cross over the second sub-pixel P in the second display region 20 to electrically connect the first light-emitting device 11 (for example, including an anode, a light-emitting layer, and a cathode) located in the first display region 10 with the first pixel circuit D (for example, including a driving transistor, a storage capacitor, etc.) located in the second display region 20 for driving the first light-emitting device 11. For example, in the embodiment shown in FIG. 10, the first connection wire 15 is in a straight line to electrically connect the first light-emitting device 11 located in the first display region 10 with the first pixel circuit D located in the second display region 20 for driving the first light-emitting device 11. For example, the data lines D (for example, D1, D2) that are used for driving the first sub-pixels in the first display region 10 may be arranged around the boundary of the second display region 20 close to the first display region 10.

For example, the pixel circuits of the sub-pixels located in a same column are electrically connected with a same data line, so that the light-emitting devices of the sub-pixels in the same column can be driven by the same data line. For example, in the embodiment shown in FIG. 10, the data line D1 on the left side is electrically connected with the pixel circuits of the first column of sub-pixels on the left side in the first display region 10 through a winding wiring way. The data line D2 on the right side is electrically connected with the pixel circuits of the second column of sub-pixels on the left side in the first display region 10. Of course, other columns of sub-pixels in the first display region 10 are also respectively connected with data lines, which is not shown in the figure.

It should be noted that, in the embodiments of the present disclosure, a column direction refers to the vertical direction in the figure, a row direction refers to the horizontal direction in the figure, in other embodiments, the column direction and the row direction can be interchanged, which is not limited in the embodiments of the present disclosure.

For example, there is a dense wiring region between the first display region 10 and the second display region 20, as shown by the dashed frame in the figure, in this case, in order to facilitate wiring and to save space, in some embodiments, the dense wiring region may adopt a jumper wire design, that is, the wires are arranged in different wiring layers.

Figure 11:
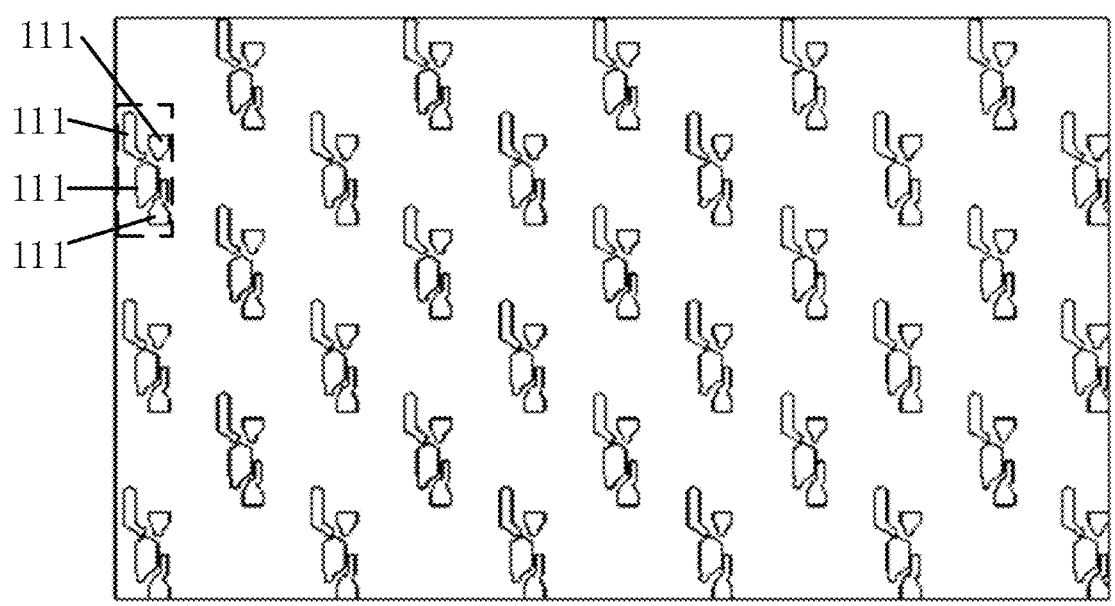
FIG. 11 is a plane schematic diagram of an arrangement of sub-pixels in a display region of a display substrate provided by at least one embodiment of the present disclosure.

For example, FIG. 11 shows a pattern of an arrangement of sub-pixels in the first display region. For example, the second sub-pixels in the second display region 20 also have an arrangement regularity of the sub-pixels as shown in FIG. 11. In the embodiment, every four sub-pixels constitute a repeating unit, and the four sub-pixels have different shapes, correspondingly, the anode structures of the light-emitting devices of the sub-pixels also have different shapes, corresponding to the light-emitting devices of the same color or different colors, for example, the repeating unit includes four sub-pixels of GGRB. For example, as shown in FIG. 11, in one repeating unit of the first display region 10, the first anode structures 111 of the first light-emitting devices of the first sub-pixels have different shapes, and the first sub-pixels are arranged as shown in FIG. 11 to correspondingly emit light of the same color or different colors, for example, four first sub-pixels 111 emit light of different colors respectively, such as green, green, red, and blue.

In a specific embodiment, the above-mentioned repeating unit is not limited to include four sub-pixels, for example, a repeating unit includes three sub-pixels of R, G, and B, or may adopt other arrangements, such as RGBG.

Figure 12:
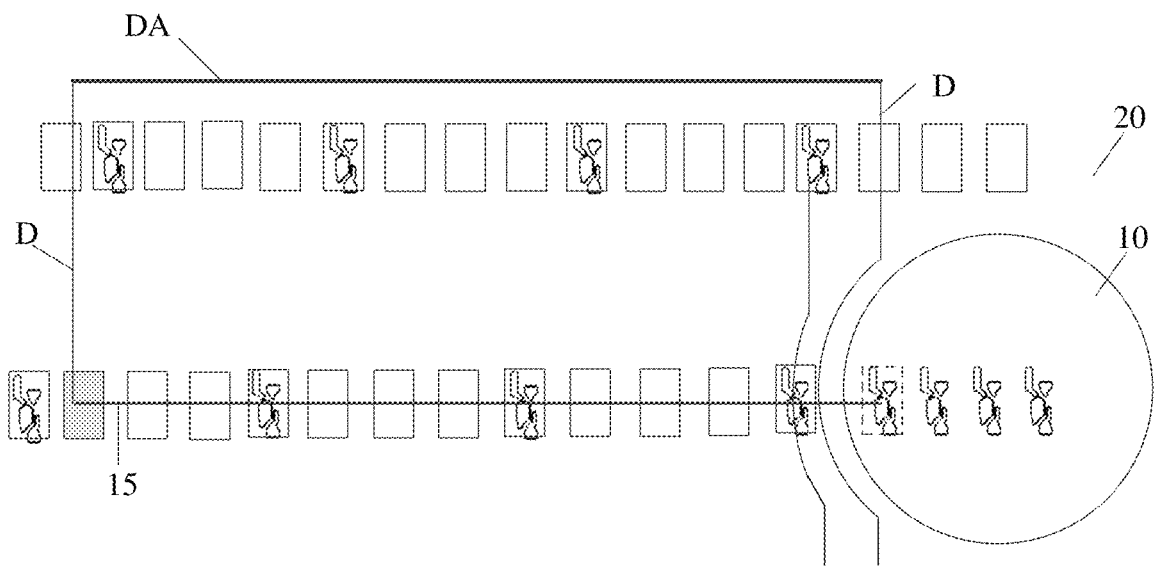
FIG. 12 is a plane schematic diagram of an arrangement of wires in a display region of a display substrate provided by at least one embodiment of the present disclosure.

For example, FIG. 12 shows a connection method of the data lines D in a case where the first sub-pixels in the first display region 10 and the second sub-pixels in the second display region 20 are arranged in the above-mentioned sub-pixel arrangement. As shown in FIG. 12, the data lines D are arranged around the boundary of the second display region 20 close to the first display region 10, and in both of the first display region 10 and the second display region 20, the pixel circuits of the sub-pixels located in a same column are electrically connected to the same data line D. For example, in the embodiment shown in FIG. 12, the first pixel circuit located in the second display region 20 shown by the gray frame is electrically connected with the light-emitting device of the first one of the first sub-pixels located on the left side in the first display region 10 through the first connection wire 15, by the winding wiring of the data line D, the pixel circuits of the sub-pixels (whether the first sub-pixel or the second sub-pixel) located in the same column as the first one of the first sub-pixels on the left side can be electrically connected with each other, so that the pixel circuits of the sub-pixels located in the same column are electrically connected with the same data line. For example, a part DA of the data line D (shown in the figure as a thick line extending horizontally on an upper side of the data line D) may be arranged by a method of jumper wire, that is, a part DA of the data line D is arranged in a different layer from other parts of the data line D. For example, in a case where the arrangement density of the data lines D is relatively high, the design of jumper wire can reduce the arrangement space of the data lines, which is more conducive to the arrangement of the wires.

For example, FIG. 12 only shows the connection wire and the data line of one first sub-pixel in the first display region 10, other first sub-pixels in the first display region 10 also have a similar connection relationship, which is not shown in the FIG. 12. For example, the region occupied by the gray frame may have a first pixel circuit of one first sub-pixel, or have first pixel circuits of more first sub-pixels in a pixel repeating unit, in this case, the one or more first pixel circuits may be electrically connected with one or more first sub-pixels of a pixel repeating unit in the first display region 10 respectively through one or more first connection wires 15.

For example, the region occupied by the gray frame may have first pixel circuits of four first sub-pixels of one pixel repeating unit, in this case, the four first pixel circuits can be electrically connected with the four first sub-pixels of one pixel unit in the first display region 10 respectively through four first connection wires 15.

For example, in some embodiments, the data line D is wiring on one side of the second display region 20, for example, FIG. 12 shows a case where the data line D is wiring on the upper side of the second display region 20. In other embodiments, as shown in FIG. 13, the data line D may also be wiring on both of the upper side and lower side of the second display region 20 at the same time.

For example, in some embodiments, the data line D is wiring between the pixel rows of the second display region 20, which is not limited in the embodiment.

Figure 13:
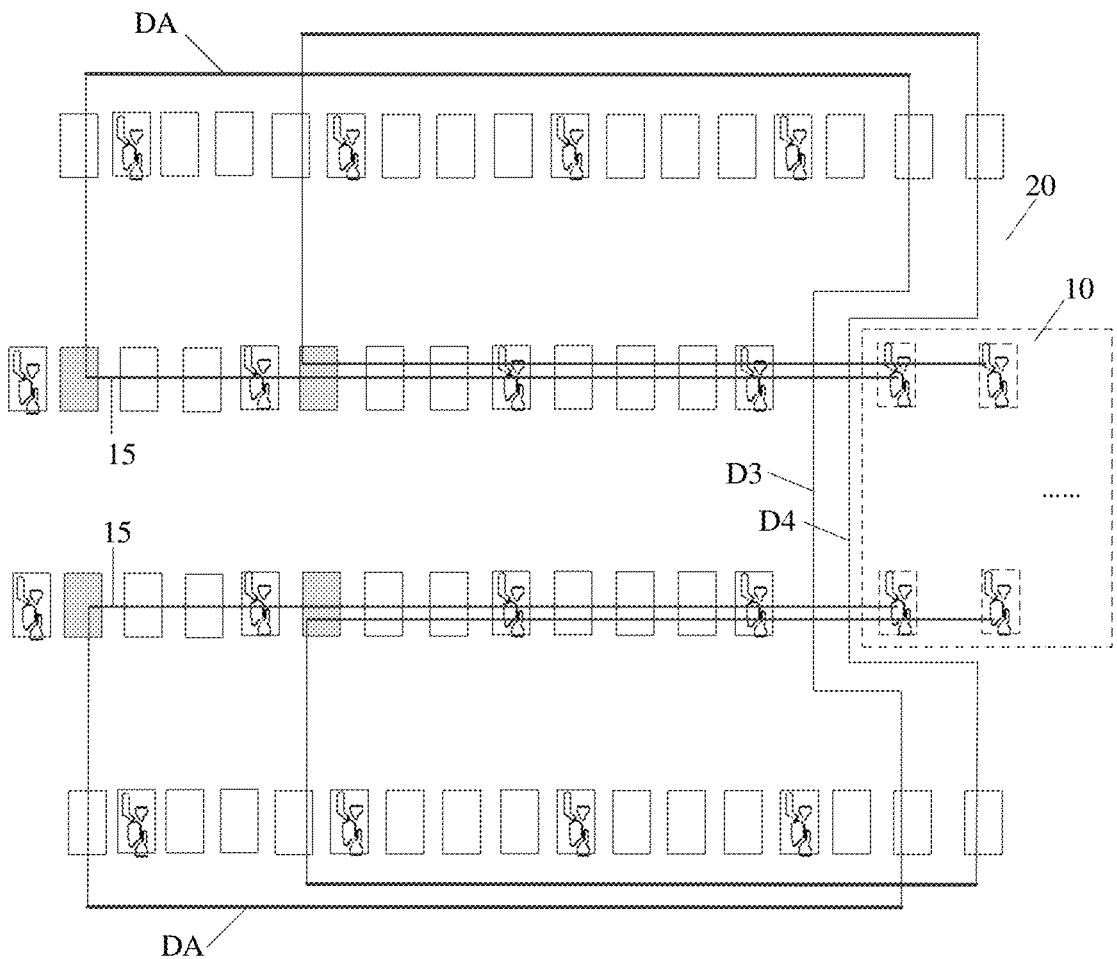
FIG. 13 is another plane schematic diagram of an arrangement of wires in a display region of a display substrate provided by at least one embodiment of the present disclosure.

For example, as shown in FIG. 13, in the embodiment, the pixel circuits of the first column of sub-pixels on the left side in the first display region 10 and the second display region 20 are electrically connected through the same data line D3 (the data line on the left side in the figure), and the pixel circuits of the second column of sub-pixels on the left side are electrically connected through the same data line D4 (the data line on the right side in the figure), in this case, the data lines are simultaneously wiring on both the upper side and the lower side of the second display region 20, so that the pixel circuits of the sub-pixels in the same column are electrically connected with each other, and the light-emitting devices of the sub-pixels in the same column can be driven by the same data line.

Similarly, parts DA of the data line D3 and the data line D4 may also adopt a design of jumper wire. For example, at the boundary of the second display region 20, the data lines are arranged densely, thus parts of the data lines wiring around the boundary can be designed with jumper wires, to save space and simplify the circuit layout.

Similarly, FIG. 13 only shows the connection wires and the data lines of the four first sub-pixels in the first display region 10, other first sub-pixels in the first display region 10 also have a similar connection relationship, which is not shown in FIG. 13. For example, the region occupied by the gray frame have first pixel circuits of four first sub-pixels of a pixel repeating unit, in this case, the four first pixel circuits can be electrically connected to the four first sub-pixels of one pixel unit in the first display region 10 respectively through four first connection wires 15.

Figure 14:
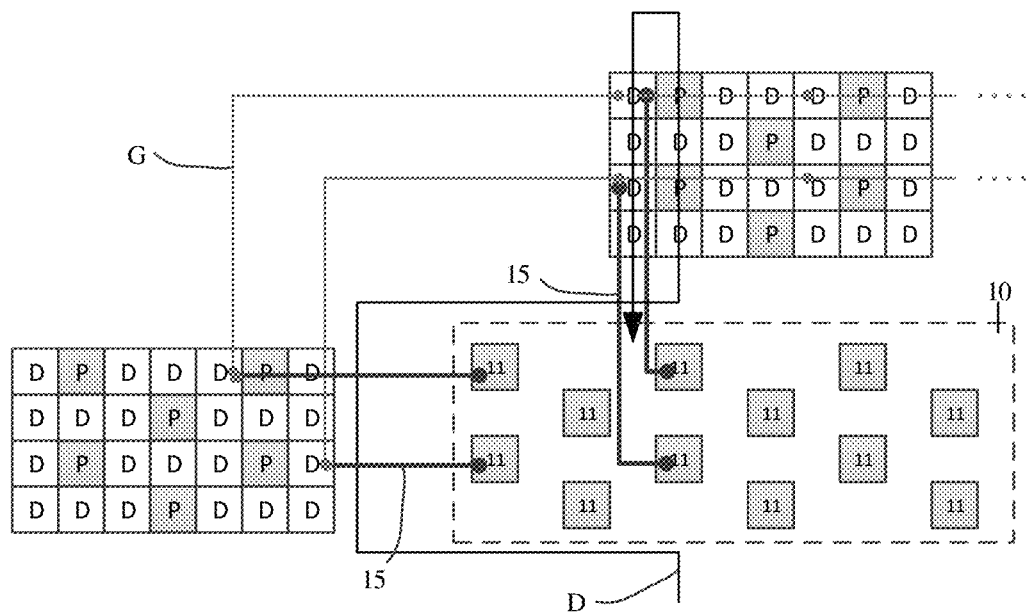
FIG. 14 is still another plane schematic diagram of a first display region and a second display region in a display substrate provided by at least one embodiment of the present disclosure.

For example, as shown in FIG. 14, the first sub-pixels located in the third column on the left side of the first display region 10 and the second sub-pixels P in the second column of the second display region 20 above the first display region 10 are located in the same column, and the first sub-pixels located in the third column on the left side of the first display region 10 (specifically, the light-emitting devices of the first sub-pixels, for example, each light-emitting device includes an anode, a light-emitting layer and a cathode) are driven by the first pixel circuits D (for example, each first pixel circuit D includes a driving transistor, a storage capacitor, etc.) in the first column in the second display region 20 above the first display region 10, in this case, the data line D4 is wiring in both the first pixel circuits D in the first column and the second sub-pixels P in the second column in the second display region 20, so that the pixel circuits of these sub-pixels in the same column are electrically connected to the same data line, in this way, the light-emitting devices of the sub-pixels in the same column can be driven by the same data line.

For example, the pixel circuits of sub-pixels located in a same row may be electrically connected to a same scanning line, so that the light-emitting devices of the sub-pixels located in the same row can be driven by the same scanning line. For example, as shown in FIG. 14, the first light-emitting device 11 of the first one of the first sub-pixels in the first row of the first display region 10 and a first pixel circuit D in the second display region 20 located on the left side of the first display region 10 are electrically connected with each other, and the light-emitting device 11 of the second one of the first sub-pixels in the first row of the first display region 10 and a first pixel circuit D in the second display region 20 located on the upper side of the first display region 10 are electrically connected with each other, by winding wiring the scanning line G1 (the scanning line on the left side in the figure), the first pixel circuits D of two first sub-pixels located in the same row (the first row in the figure) can be electrically connected. Similarly, the first light-emitting device 11 of the first one of the first sub-pixels in the third row of the first display region 10 and a first pixel circuit D in the second display region 20 located on the left side of the first display region 10 are electrically connected with each other, and the light-emitting device 11 of the second one of the first sub-pixels in the third row of the first display region 10 and a first pixel circuit D in the second display region 20 located on the upper side of the first display region 10 are electrically connected with each other, by winding wiring the scanning line G2 (the scanning line on the right side in the figure), the first pixel circuits D of two first sub-pixels located in the same row (the third row in the figure) can be electrically connected. Therefore, the light-emitting devices of the sub-pixels located in the same row can be driven by the same scanning line.

In this way, in the embodiments of the present disclosure, by winding wiring scanning lines and data lines, the pixel circuits of the sub-pixels located in the same column can be electrically connected to the same data line, and the pixel circuits of the sub-pixels located in the same row can be electrically connected to the same scanning line, so as to simplify the drive control of each of the sub-pixels in the display panel.

For example, in FIG. 14, the wires in different lines are respectively arranged in different wiring layers, that is, the wires in different lines are arranged in different layers. For example, the first connection wire 15 with the darkest color and the thickest line in the figure, the data line D with darker color but thinner line and the scanning line G with the lightest color and thinner line are respectively arranged in different layers, and therefore are formed of different material layers in the manufacturing process.

For example, as shown in FIG. 4, the first pixel circuit D for driving the first light-emitting device 11 includes a thin film transistor 12 and a storage capacitor 13, the thin film transistor 12 includes an active layer 121, a gate electrode 122, and source and drain electrodes (that is, a source electrode 123 and a drain electrode 124) and other structures, the storage capacitor 13 includes a first capacitor plate 131 and a second capacitor plate 132.

For example, the active layer 121 is arranged on the base substrate 14, a first gate insulating layer 141 is arranged on a side of the active layer 121 away from the base substrate 14, the gate electrode 122 and the first capacitor plate 131 are arranged in a same layer and on a side of the first gate insulating layer 141 away from the base substrate 14, a second gate insulating layer 142 is arranged on a side of the gate electrode 122 and the first capacitor plate 131 away from the base substrate 14, the second capacitor plate 132 is arranged on a side of the second gate insulating layer away from the base substrate 14, an interlayer insulating layer 143 is arranged on a side of the second capacitor plate 132 away from the base substrate 14, the source and drain electrodes are arranged on a side of the interlayer insulating layer 143 away from the base substrate 14, and the source and drain electrodes are electrically connected with the active layer 121 through the vias passing through the first gate insulating layer 141, the second gate insulating layer 142, and the interlayer insulating layer 143, and a planarization layer 144 is arranged on a side of the source and drain electrodes away from the base substrate 14 to planarize the first pixel circuit.

Figure 15:
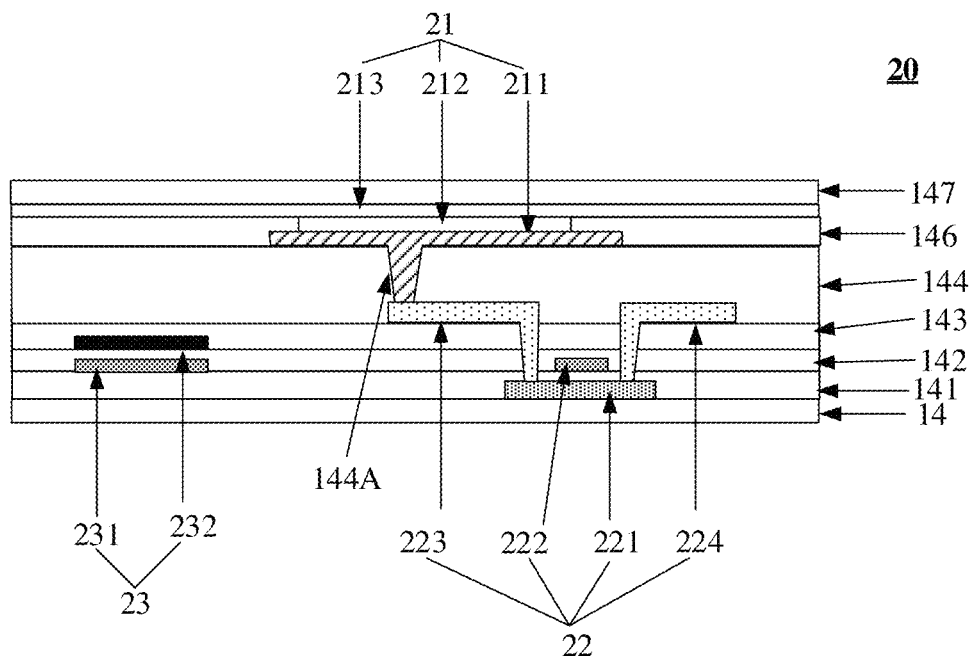
FIG. 15 is a cross-sectional schematic diagram of a second display region in a display substrate provided by at least one embodiment of the present disclosure.

For example, FIG. 15 shows a cross-sectional schematic diagram of the second display region 20, as shown in FIG. 15, the second display region 20 includes a second light-emitting device 21 and a second pixel circuit that drives the second light-emitting device 21. For example, the second pixel circuit includes structures such as a thin film transistor 22 and a storage capacitor 23. The second light-emitting device 21 includes a second anode structure 211, a second cathode structure 213, and a second light-emitting layer 212 between the second anode structure 211 and the second cathode structure 213, and the second anode structure 211 is electrically connected with the second pixel circuit through a via. For example, the second anode structure 211 includes a plurality of anode sub-layers, for example, including an ITO/Ag/ITO three-layer structure (not shown in the figure). The specific form of the second anode structure 211 is not limited in the embodiments of the present disclosure.

For example, the thin film transistor 22 includes an active layer 221, a gate electrode 222, and source and drain electrodes (that is, a source electrode 223 and a drain electrode 224) and other structures, the storage capacitor 23 includes a first capacitor plate 231 and a second capacitor plate 232. For example, the active layer 221 is arranged on the base substrate 14, a first gate insulating layer 141 is arranged on a side of the active layer 221 away from the base substrate 14, and the gate electrode 222 and the first capacitor plate 231 are arranged in a same layer and on a side of the first gate insulating layer 141 away from the base substrate 14, a second gate insulating layer 142 is arranged on a side of the gate electrode 222 and the first capacitor plate 231 away from the base substrate 14, the second capacitor plate 232 is arranged on a side of the second gate insulating layer 142 away from the base substrate 14, an interlayer insulating layer 143 is arranged on a side of the second capacitor plate 232 away from the base substrate 14, the source and drain electrodes are arranged on a side of the interlayer insulating layer 143 away from the base substrate 14, the source and drain electrodes are electrically connected with the active layer 221 through the vias passing through the first gate insulating layer 141, the second gate insulating layer 142, and the interlayer insulating layer 143; and a planarization layer 144 is arranged on a side of the source and drain electrodes away from the base substrate 14 to planarize the second pixel circuit.

For example, the planarization layer 144 is provided with a via 144A, the second anode structure 211 is electrically connected with the source electrode 223 of the thin film transistor 22 through the via 144A in the planarization layer 144.

For example, in some embodiments, a transition layer (not shown in the figure) is provided between the source electrode 223 and the second anode structure 211, and the transition layer is arranged in a same layer as the first connection wire 15.

Figure 16:
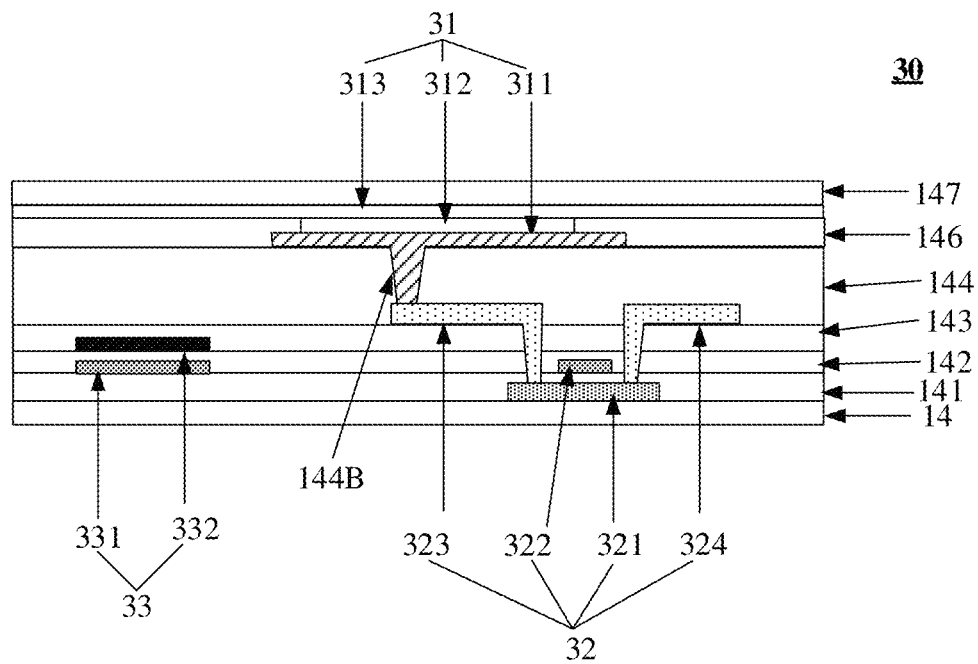
FIG. 16 is a cross-sectional schematic diagram of a third display region in a display substrate provided by at least one embodiment of the present disclosure.

For example, as shown in FIG. 3, the display region further includes a third display region 30 at least partially surrounding the second display region 20, the third display region 30 includes a plurality of third sub-pixels arranged in an array. For example, FIG. 16 shows a cross-sectional schematic diagram of a third display region 30, as shown in FIG. 16, each of the third sub-pixels includes a third light-emitting device 31 and a third pixel circuit that is electrically connected with the third light-emitting device 31, the third pixel circuit is configured to drive the third light-emitting device 31. The third light-emitting device 31 includes a third anode structure 311, a third cathode structure 313, and a third light-emitting layer 312 located between the third anode structure 311 and the third cathode structure 313, the third anode structure 311 is electrically connected with the third pixel circuit through a via. For example, the third anode structure 311 includes a plurality of anode sub-layers, for example, including an ITO/Ag/ITO three-layer structure (not shown in the figure), and the specific form of the third anode structure 311 is not limited in the embodiments of the present disclosure.

For example, the third pixel circuit includes structures such as a thin film transistor 32 and a storage capacitor 33. For example, the thin film transistor 32 includes an active layer 331, a gate electrode 332, and source and drain electrodes (that is, a source electrode 233 and a drain electrode 234) and other structures, the storage capacitor 33 includes a first capacitor plate 331 and a second capacitor plate 332. For example, the active layer 321 is arranged on the base substrate 14, a first gate insulating layer 141 is arranged on a side of the active layer 321 away from the base substrate 14, the gate electrode 322 and the first capacitor plate 331 are arranged in a same layer and on a side of the first gate insulating layer 141 away from the base substrate 14, a second gate insulating layer 142 is arranged on a side of the gate electrode 322 and the first capacitor plate 331 away from the base substrate 14, the second capacitor plate 332 is arranged on a side of the second gate insulating layer 142 away from the base substrate 14, an interlayer insulating layer 143 is arranged on a side of the second capacitor plate 332 away from the base substrate 14, the source and drain electrodes are arranged on a side of the interlayer insulating layer 143 away from the base substrate 14, the source and drain electrodes are electrically connected with the active layer 321 through the vias passing through the first gate insulating layer 141, the second gate insulating layer 142, and the interlayer insulating layer 143, and a planarization layer 144 is arranged on a side of the source and drain electrodes away from the base substrate 14 to planarize the third pixel circuit.

For example, the planarization layer 144 is provided with a via 144B, the third anode structure 311 is electrically connected with the source electrode 323 of the thin film transistor 32 through the via 144B in the insulating layer 145.

For example, in some embodiments, a transition layer (not shown in the figure) is provided between the source electrode 323 and the second anode structure 311, and the transition layer is arranged in a same layer as the first connection wire 15.

For example, both the first pixel circuit and the second pixel circuit in the second display region 20 and the third pixel circuit in the third display region 30 are arranged in a same layer, so that a same patterning process can be used in the manufacturing process. For example, the first gate insulating layer 141, the second gate insulating layer 142, the interlayer insulating layer 143, and the planarization layer 144 are arranged in the same layer in the second display region 20 and the third display region 30, in some embodiments, the first gate insulating layer 141, the second gate insulating layer 142, the interlayer insulating layer 143, and the planarization layer 144 are integrally connected with each other, thus the same reference numerals are used in the figures.

For example, in some embodiments, as shown in FIG. 4 and FIG. 6 to FIG. 8, the first display region 10 also includes a transparent support layer 18 on the base substrate 14, and the first light-emitting device 11 is located on a side of the transparent support layer 18 away from the base substrate 14. In this way, with respect to the base substrate 14, the first light-emitting device 11 in the first display region 10 may be at substantially a same height as both the second light-emitting device 21 in the second display region 20 and the third light-emitting device 31 in the third display region 30, so that the display effect of the display substrate can be improved.

For example, the transparent support layer 18 is arranged in the same layer as at least one of the first gate insulating layer 141, the second gate insulating layer 142, the interlayer insulating layer 143, and the planarization layer 144. For example, the transparent support layer 18 is arranged in the same layer as all of the first gate insulating layer 141, the second gate insulating layer 142, the interlayer insulating layer 143, and the planarization layer 144, so that the first light-emitting device 11 in the first display region 10 is at substantially a same height as both the second light-emitting device 21 in the second display region 20 and the third light-emitting device 31 in the third display region 30, and the manufacturing process of the display substrate is simplified.

For example, in some embodiments, the display substrate further includes a pixel defining layer 146, an encapsulation layer 147 and other structures. For example, the pixel defining layer 146 is arranged on the first anode structure, and includes a plurality of openings, the first light-emitting layer is formed in the openings of the pixel defining layer 146. For example, the encapsulation layer 147 includes a single-layer or multi-layer encapsulation structure, the multi-layer encapsulation structure includes, for example, stack layers of an inorganic encapsulation layer and an organic encapsulation layer, so that the encapsulation effect on the display substrate is improved.

For example, in the first display region 10, the second display region 20, and the third display region 30, the pixel defining layer 146 and the encapsulation layer 147 are arranged in a same layer, and in some embodiments the pixel defining layer 146 and the encapsulation layer 147 are integrally connected with each other, thus the same reference numerals are used in the figures.

For example, in various embodiments of the present disclosure, the base substrate 14 is a glass substrate, a quartz substrate, a metal substrate, a resin substrate, or the like. The embodiments of the present disclosure are not limited in this aspect.

For example, all of the first gate insulating layer 141, the second gate insulating layer 142, the interlayer insulating layer 143, the planarization layer 144, the insulating layer 145, the pixel defining layer 146, the encapsulation layer 147, and the insulating layer 148 may include inorganic insulating materials such as silicon oxide, silicon nitride and silicon oxynitride and so on, or include organic insulating materials such as polyimide, polyphthalimide, polyphthalamide, acrylic resin, benzocyclobutene, or phenol resin and so on. The embodiments of the present disclosure do not specifically limit the materials of the above-mentioned functional layers.

For example, the material of the active layer includes a semiconductor material such as polysilicon or oxide semiconductor (for example, indium gallium zinc oxide). For example, a part of the active layer 121/221/321 is made into a conductor by a conduction treatment such as doping, so that the part of the active layer 121/221/321 has a higher conductivity.

For example, the materials of the gate electrode, the first capacitor plate, and the second capacitor plate may include metal materials or alloy materials, such as molybdenum, aluminum, and titanium.

For example, the material of the source and drain electrodes include metal materials or alloy materials, such as a metal single-layer or multi-layer structure formed of molybdenum, aluminum, and titanium, etc., for example, the multi-layer structure is a multi-metal stacked layer, such as a three-layer metal stacked layer of titanium, aluminum, and titanium (Ti/Al/Ti).

For example, the display substrate provided by the embodiments of the present disclosure is a display substrate such as an organic light-emitting diode (OLED) display substrate or a quantum dot light-emitting diode (QLED) display substrate, and the embodiments of the present disclosure do not limit the specific types of display substrates.

For example, in a case where the display substrate is an organic light-emitting diode display substrate, the light-emitting layer 111/211/311 may include small molecular organic materials or polymer molecular organic materials, which may be a fluorescent light-emitting material or a phosphorescent light-emitting material, and the fluorescent light-emitting material or the phosphorescent light-emitting material can emit red light, green light, blue light, or white light. In addition, according to actual needs, in different examples, the light-emitting layer 111/211/311 may further include functional layers such as an electron injection layer, an electron transport layer, a hole injection layer, a hole transport layer, and the like.

For example, in a case where the display substrate is a quantum dot light-emitting diode (QLED) display substrate, the light-emitting layer 111/211/311 may include quantum dot materials, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and arsenide Indium quantum dots, and a particle size of the quantum dots ranges from 2 nm to 20 nm.

For example, in the embodiments of the present disclosure, the first display region 10 may be in various shapes such as a circle (the situation shown in FIG. 3), a rectangle, a triangle, or the like, and the shape of the first display region 10 in the embodiments of the present disclosure are not limited.

For example, in some embodiments, as shown in FIG. 4 and FIG. 6 to FIG. 8, the display substrate may further include a sensor 19, such as an image sensor, an infrared sensor, a distance sensor, or the like, for example, the sensor 19 is implemented in the form of a chip or other forms. For example, the sensor 19 is arranged on the second side of the display substrate, for example, the sensor 19 is arranged on the second side of the display panel by means of a double-sided tape or other methods, and an orthographic projection of the sensor 19 on the base substrate 14 at least partially overlaps with the first display region 10, and the sensor 19 is configured to receive light from the first side. In this way, the first display region 10 provides convenience for the arrangement of the sensor 19 while realizing display.

At least one embodiment of the present disclosure further provides a manufacturing method of a display substrate, the display substrate has a first side (a display side) for display and a second side (a non-display side or a back side) opposite to the first side, and the manufacturing method includes: forming a display region, and forming at least one first connection wire in the first display region and the second display region. The display region includes a first display region and a second display region at least partially surrounding the first display region, and the first display region allows light from the first side to be at least partially transmitted to the second side. The first connection wire includes a first portion located in the first display region and a second portion located in the second display region, the first portion and the second portion are electrically connected with each other, the first portion includes a first light-transmitting wiring layer, and the second portion includes a metal wiring layer.

For example, in some embodiments, the forming of the display region further includes: forming a plurality of first sub-pixels arranged in an array in the first display region, in which each of the first sub-pixels includes a first light-emitting device, and forming a plurality of first pixel circuits in the second display region, in which the at least one first connection wire includes a plurality of first connection wires; the plurality of first pixel circuits are respectively electrically connected with the first light-emitting devices of the plurality of first sub-pixels through the plurality of first connection wires, so as to drive the first light-emitting devices of the plurality of first sub-pixels.

For example, in some embodiments, the forming of the second portion of the first connection wire further includes: forming a second light-transmitting wiring layer stacked with the metal wiring layer, and the second light-transmitting wiring layer and the first light-transmitting wiring layer are formed in a same layer and are integrally connected with each other.

For example, in some embodiments, the manufacturing method of the display substrate further includes: providing a base substrate, in this case, the forming of the second portion of the first connection wire further includes: forming an anti-oxidation protection layer stacked with the metal wiring layer. The second light-transmitting wiring layer is formed on the base substrate, the metal wiring layer is formed on a side of the second light-transmitting wiring layer away from the base substrate, and the anti-oxidation protection layer is formed on a side of the metal wiring layer away from the base substrate.

Hereinafter, the display substrate shown in FIG. 4 is taken as an example, and the manufacturing method of the display substrate provided by at least one embodiment of the present disclosure is introduced as follows.

Figure 17A:
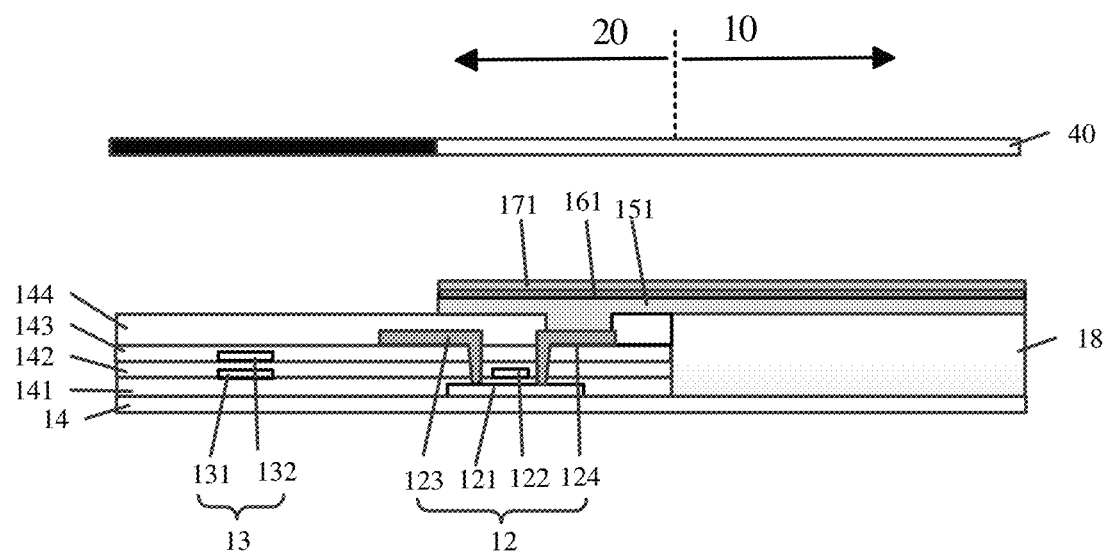
FIG. 17A and FIG. 17B are cross-sectional schematic diagrams of a display substrate in a manufacturing process provided by at least one embodiment of the present disclosure.

For example, as shown in FIG. 17A, the pixel circuits in the second display region 20 and the third display region 30 (including the first pixel circuits, the second pixel circuits, and the third pixel circuits) are simultaneously formed on the base substrate 14 by patterning processes, at the same time, a transparent support layer 18 is formed.

Taking the forming of the first pixel circuit as an example, as shown in FIG. 17A, the forming of the first pixel circuit includes forming a thin film transistor 12 and a storage capacitor 13, the thin film transistor 12 includes an active layer 121, a gate electrode 122, and source and drain electrodes 123 and 124; and the storage capacitor 13 includes a first capacitor plate 131 and a second capacitor plate 132. As shown in FIG. 17A, the active layer 121 is formed on the base substrate 14, the first gate insulating layer 141 is formed on a side of the active layer 121 away from the base substrate 14, the gate electrode 122 and the first capacitor plate 131 are formed in a same layer on the first gate insulating layer 141, the second gate insulating layer 142 is formed on a side of the gate electrode 122 and the first capacitor plate 131 away from the base substrate 14, the second capacitor plate 132 is formed on a side of the second gate insulating layer 142 away from the base substrate 14, the interlayer insulating layer 143 is formed on a side of the second capacitor plate 132 away from the base substrate 14, the source and drain electrodes 123 and 124 are formed on a side of the interlayer insulating layer 143 away from the base substrate 14, the source and drain electrodes 123 and 124 are electrically connected with the active layer 121 through the vias passing through the first gate insulating layer 141, the second gate insulating layer 142, and the interlayer insulating layer 143, and then the planarization layer 144 is formed on a side of the source and drain electrodes 123 and 124 away from the base substrate 14. For example, a via exposing one of the source and drain electrodes is formed in the planarization layer 144. For example, the transparent support layer 18 is formed in a same layer as at least one of the first gate insulating layer 141, the second gate insulating layer 142, the interlayer insulating layer 143 and the planarization layer 144. For example, the transparent support layer 18 is formed in a same layer as all of the first gate insulating layer 141, the second gate insulating layer 142, the interlayer insulating layer 143, and the planarization layer 144.

For example, each of the above-mentioned functional layers is formed by a patterning process. One patterning process includes photoresist forming, exposing, developing, etching, and the like.

For example, in some embodiments, before forming the above structures, a buffer layer (not shown in the figure) may also be formed on the base substrate 14, the buffer layer serves as a transition layer to prevent harmful substances in the base substrate 14 from intruding into the interior of the display substrate, and to increase the adhesion of the film layers in the display substrate on the base substrate 14. For example, a material of the buffer layer includes a single-layer or multi-layer structure formed of insulating materials such as silicon oxide, silicon nitride, and silicon oxynitride.

For example, after the above-mentioned structures are formed, the first connection wires are formed in the first display region 10 and the second display region 20. For example, as shown in FIG. 17A, a light-transmitting wiring material layer 151, a metal wiring material layer 161 and a conductive protective material layer 171 are sequentially deposited in both the first display region 10 and the second display region 20 through a mask 40. For example, the mask 40 is provided with a hollow portion (that is, the white portion in the figure), so that the material forms a certain pattern through the hollow portion. In this way, the light-transmitting wiring material layer 151, the metal wiring material layer 161, and the conductive protective material layer 171 deposited through the mask 40 have substantially the same pattern.

Figure 17B:
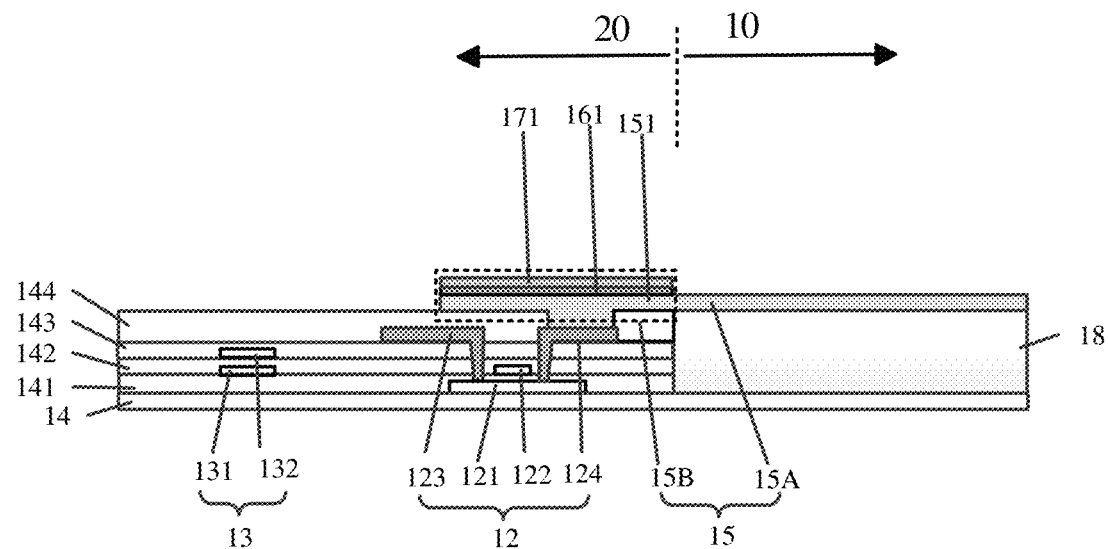

Then, as shown in FIG. 17B, a dry etching method is used for etching the metal wiring material layer 161 and the conductive protective material layer 171 located in the first display region 10, while only the metal wiring material layer 161 and the conductive protective material layer 171 located in the second display region 20 remain. In this way, the first connection wire 15 including the first portion 15A and the second portion 15B is formed. Because the dry etching method is easy to control and can precisely control the etching thickness of the metal wiring material layer 161 and the conductive protective material layer 171, the first connection wire 15 can be formed by a single dry etching method.

Figure 18A:
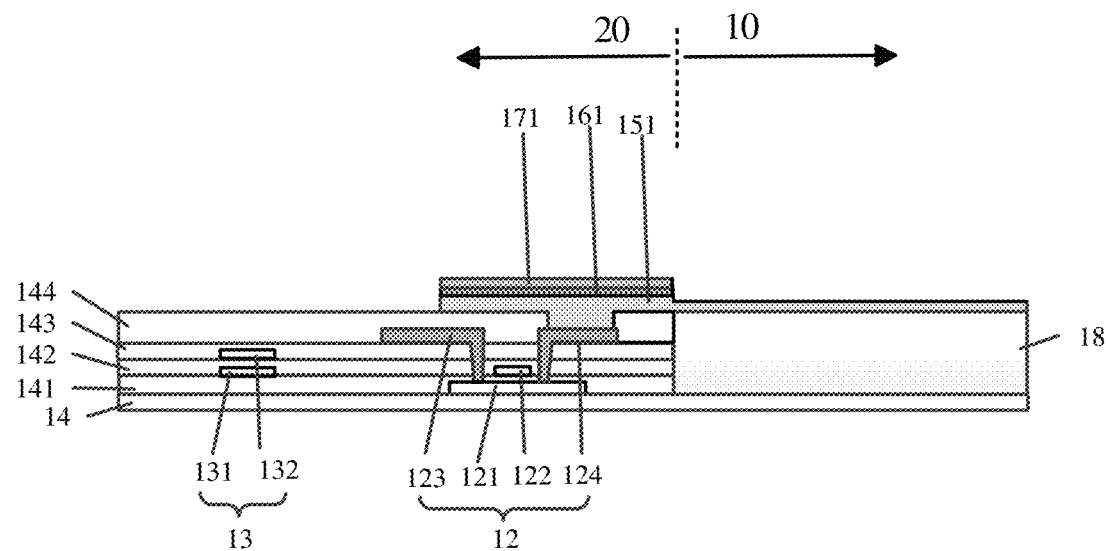
FIG. 18A and FIG. 18B are cross-sectional schematic diagrams of a display substrate in a manufacturing process provided by at least one embodiment of the present disclosure.
Figure 18B:
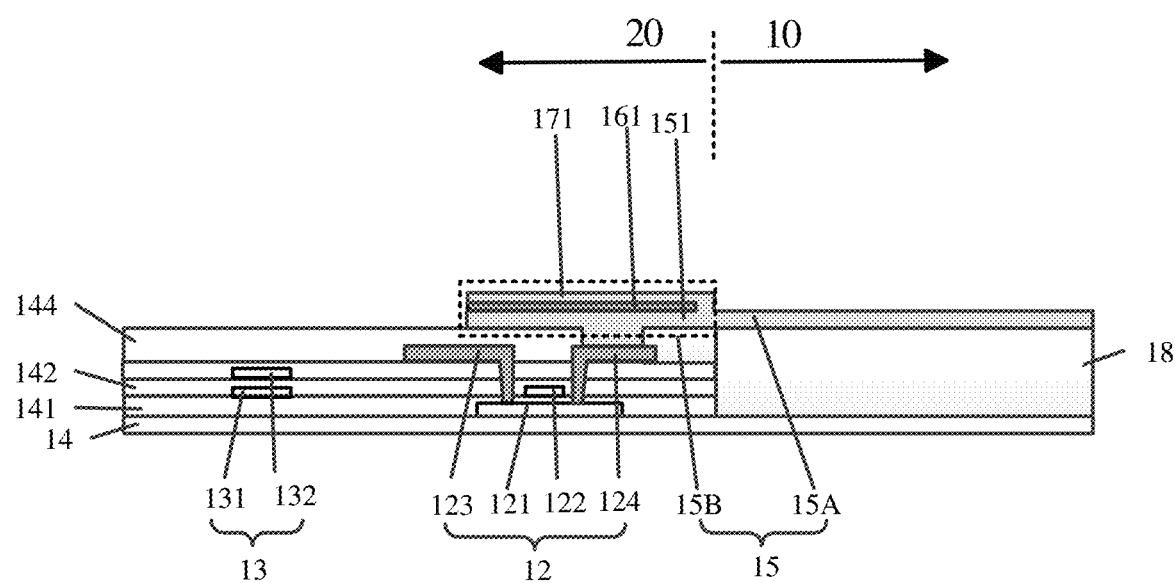

For example, in other embodiments, after the light-transmitting wiring material layer 151, the metal wiring material layer 161, and the conductive protective material layer 171 are sequentially deposited in both the first display region 10 and the second display region 20 through the mask 40, a wet etching method may be used for etching the metal wiring material layer 161 and the conductive protective material layer 171 located in the first display region 10. However, because the low etching accuracy of the wet etching method, the etching thickness is not easy to control, in order to ensure that the metal wiring material layer 161 and the conductive protective material layer 171 in the first display region 10 are completely removed, an over-etching method is usually used. In this case, as shown in FIG. 18A, a part of the light-transmitting wiring material layer 151 located in the first display region 10 may be partially etched to ensure the thickness of the light-transmitting wiring material layer 151 in the first display region 10 and its connectivity with the light-transmitting wiring material layer 151 in the second display region 20, after the above-mentioned wet etching, the mask 40 is used again to deposit a light-transmitting wiring material layer in both the first display region 10 and the second display region 20 to increase the thickness of the light-transmitting wiring layer in the first display region 10, in this case, the light-transmitting wiring material layer will also be formed on the right side of the metal wiring material layer 161, as shown in FIG. 18B.

For example, in some embodiments, because the light-transmitting wiring material layer 151 and the conductive protective material layer 171 may use the same material, for example, using ITO, as shown in FIG. 18, the light-transmitting wiring material layer 151 and the conductive protective material layer 171 are in an integrally connected structure.

For example, in other embodiments, a substantially same method can be used to form the display substrate as shown in FIG. 7 and FIG. 8. For example, in a case where the display substrate shown in FIG. 7 is formed, after the light-transmitting wiring material layer 151, the metal wiring material layer 161, and the conductive protective material layer 171 are sequentially deposited in both the first display region 10 and the second display region 20 through the mask 40, a dry etching method may be used to etch away a part of both the metal wiring material layer 161 and the conductive protective material layer 171 located in the first display region 10, so that the first connection wire 15 and the first anode structure 111 are formed in the same layer. For example, in this embodiment, the material of the light-transmitting wiring material layer 151 is ITO, the material of the metal wiring material layer 161 is Ag, and the conductive protection material layer 171 is ITO.

For example, in a case where the display substrate shown in FIG. 8 is formed, a patterning process may be used to form the metal wiring layer of the second portion 15B first, then an insulating layer 148 is formed on the metal wiring layer, and a via is formed in the insulating layer 148. After that, a patterning process is used to form the first light-transmitting wiring layer of the first portion 15A on the insulating layer 148, the first light-transmitting wiring layer is electrically connected with the second portion 15B through the via formed in the insulating layer 148, so that a first connection wire including the first portion 15A and the second portion 15B is formed.

For example, after the first connection wire 15 is formed, the manufacturing method of the display substrate further includes forming structures such as a pixel defining layer, a light-emitting device, and an encapsulation layer on the first connection wire 15, the specific forming methods of these structures can be referred to related technologies, which is not repeated herein.

For example, referring to FIG. 4 and FIG. 6 to FIG. 8, after the formation of the above-mentioned structures of the display substrate is completed, the manufacturing method of the display substrate may further include: providing a sensor, and connecting the sensor to the second side of the display substrate. In this case, an orthographic projection of the sensor on the base substrate at least partially overlaps with the first display region, so that the light from the first side can be received through the first display region.

In the display substrate and the manufacturing method thereof provided by the embodiments of the present disclosure, the first display region has relatively high light transmittance, so that the first display region can provide convenience for the arrangement of the sensor while realizing display. In addition, the first connection wires located in both the first display region and the second display region have lower resistance, so that the signal transmission speed of the first connection wires can be increased; in a case where a plurality of first connection wires are used to transmit driving signals for a plurality of first light-emitting devices in the first display region, the current flowing through the plurality of first connection wires 15 has high uniformity, so that the display effect of the display substrate can be further improved.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A display substrate, having a first side for display and a second side opposite to the first side, and the display substrate comprising:
    a display region, wherein the display region comprises a first display region and a second display region at least partially surrounding the first display region, and the first display region allows light from the first side to be at least partially transmitted to the second side; and
    at least one first connection wire in both of the first display region and the second display region, wherein the first connection wire comprises a first portion in the first display region and a second portion in the second display region, the first portion and the second portion are electrically connected with each other, the first portion comprises a first light-transmitting wiring layer, and the second portion comprises a metal wiring layer;
    the first display region comprises a plurality of first sub-pixels arranged in an array, each of the first sub-pixels comprises a first light-emitting device, and the at least one first connection wire comprises a plurality of first connection wires;
    the second display region comprises a plurality of first pixel circuits, and the plurality of first pixel circuits are respectively electrically connected with first light-emitting devices of the plurality of first sub-pixels through the plurality of first connection wires, so as to drive the first light-emitting devices of the plurality of first sub-pixels.

2. The display substrate according to claim 1, wherein the second portion further comprises a second light-transmitting wiring layer stacked with the metal wiring layer, and the second light-transmitting wiring layer and the first light-transmitting wiring layer are arranged in a same layer and are integrally connected with each other.

3. The display substrate according to claim 2, wherein the second portion further comprises an anti-oxidation protection layer stacked with the metal wiring layer,
    the display substrate comprises a base substrate, the second light-transmitting wiring layer is on the base substrate, the metal wiring layer is on a side of the second light-transmitting wiring layer away from the base substrate, and the anti-oxidation protection layer is on a side of the metal wiring layer away from the base substrate.

4. The display substrate according to claim 3, wherein a material of the metal wiring layer comprises Ag, Al, Mo or Ti; and
    a material of the anti-oxidation protection layer comprises a transparent oxide.

5. The display substrate according to claim 1, wherein the first light-emitting device comprises a first anode structure, a first cathode structure, and a first light-emitting layer between the first anode structure and the first cathode structure; and
    the first portion is electrically connected with the first anode structure through a via.

6. The display substrate according to claim 1, wherein the second display region further comprises a plurality of second sub-pixels, each of the second sub-pixels comprises a second light-emitting device and a second pixel circuit electrically connected with the second light-emitting device, the second pixel circuit is configured to drive the second light-emitting device, and
    in the second display region, a plurality of second pixel circuits are arranged in a first array.

7. The display substrate according to claim 6, wherein in the second display region, the plurality of first pixel circuits are arranged in the first array, and the plurality of first pixel circuits and the plurality of second pixel circuits are arranged in a second array.

8. The display substrate according to claim 6, wherein the second light-emitting device comprises a second anode structure, a second cathode structure, and a second light-emitting layer between the second anode structure and the second cathode structure, and
    the second anode structure is electrically connected with the second pixel circuit through a via.

9. The display substrate according to claim 1, wherein the display region further comprises a third display region at least partially surrounding the second display region, the third display region comprises a plurality of third sub-pixels arranged in an array, each of the third sub-pixels comprises a third light-emitting device and a third pixel circuit electrically connected with the third light-emitting device, and the third pixel circuit is configured to drive the third light-emitting device, and
    the third light-emitting device comprises a third anode structure, a third cathode structure, and a third light-emitting layer between the third anode structure and the third cathode structure, and the third anode structure is electrically connected with the third pixel circuit through a via.

10. The display substrate according to claim 1, wherein the display substrate comprises a base substrate,
    the first display region further comprises a transparent support layer on the base substrate, and the first light-emitting device is on a side of the transparent support layer away from the base substrate.

11. The display substrate according to claim 10, wherein the first pixel circuit comprises a thin film transistor and a storage capacitor, the thin film transistor comprises an active layer, a gate electrode, and source and drain electrodes; the storage capacitor comprises a first capacitor plate and a second capacitor plate,
    the active layer is on the base substrate, and a first gate insulating layer is arranged on a side of the active layer away from the base substrate, the gate electrode and the first capacitor plate are arranged in a same layer and on a side of the first gate insulating layer away from the base substrate, and a second gate insulating layer is arranged on a side of the gate electrode and the first capacitor plate away from the base substrate, the second capacitor plate is arranged on a side of the second gate insulating layer away from the base substrate, and an interlayer insulating layer is arranged on a side of the second capacitor plate away from the base substrate, the source and drain electrodes are arranged on a side of the interlayer insulating layer away from the base substrate, and are electrically connected with the active layer through vias passing through the first gate insulating layer, the second gate insulating layer, and the interlayer insulating layer, and a planarization layer is arranged on a side of the source and drain electrodes away from the base substrate; and the transparent support layer is arranged in a same layer as at least one of the first gate insulating layer, the second gate insulating layer, the interlayer insulating layer, and the planarization layer.

12. The display substrate according to claim 10, further comprising a sensor, wherein the sensor is arranged on the second side of the display substrate, and an orthographic projection of the sensor on the base substrate at least partially overlaps with the first display region, and the sensor is configured to receive light from the first side.

13. A manufacturing method of a display substrate, the display substrate having a first side for display and a second side opposite to the first side, and the manufacturing method comprising:

forming a display region, wherein the display region comprises a first display region and a second display region at least partially surrounding the first display region, and the first display region allows light from the first side to be at least partially transmitted to the second side; and forming at least one first connection wire in both of the first display region and the second display region, wherein the first connection wire comprises a first portion in the first display region and a second portion in the second display region, the first portion and the second portion are electrically connected with each other, and the first portion comprises a first light-transmitting wiring layer, and the second portion comprises a metal wiring layer;

the forming the display region further comprises:

forming a plurality of first sub-pixels arranged in an array in the first display region, wherein each of the first sub-pixels comprises a first light-emitting device, and forming a plurality of first pixel circuits in the second display region, wherein the at least one first connection wire comprises a plurality of first connection wires; and the plurality of first pixel circuits are respectively electrically connected with the first light-emitting devices of the plurality of first sub-pixels through the plurality of first connection wires, so as to drive the first light-emitting devices of the plurality of first sub-pixels.

14. The manufacturing method of the display substrate according to claim 13, wherein the forming the second portion of the first connection wire further comprises:

forming a second light-transmitting wiring layer stacked with the metal wiring, wherein the second light-transmitting wiring layer and the first light-transmitting wiring layer are formed in a same layer and are integrally connected with each other.

15. The manufacturing method of the display substrate according to claim 14, further comprising: providing a base substrate, wherein the forming the second portion of the first connection wire further comprises: forming an anti-oxidation protection layer stacked with the metal wiring, wherein the second light-transmitting wiring layer is formed on the base substrate, the metal wiring layer is formed on a side of the second light-transmitting wiring layer away from the base substrate, and the anti-oxidation protection layer is formed on a side of the metal wiring layer away from the base substrate.

16. The manufacturing method of the display substrate according to claim 15, wherein the forming the first connection wire comprises:

depositing a light-transmitting wiring material layer, a metal wiring material layer, and a conductive protective material layer sequentially in both of the first display region and the second display region through a mask; and etching the metal wiring material layer and the conductive protective material layer in the first display region by a dry etching method.

17. The manufacturing method of the display substrate according to claim 15, wherein the forming the first connection wire comprises:

depositing a light-transmitting wiring material layer, a metal wiring material layer, and a conductive protective material layer sequentially in both of the first display region and the second display region through a mask;

etching the metal wiring material layer and the conductive protective material layer in the first display region by a wet etching method; and depositing a transparent wiring material layer in both of the first display region and the second display region through the mask.

18. The manufacturing method of the display substrate according to claim 15, wherein the forming the first pixel circuit comprises forming a thin film transistor and a storage capacitor, the thin film transistor comprises an active layer, a gate electrode, and source and drain electrodes; the storage capacitor comprises a first capacitor plate and a second capacitor plate, wherein the active layer is formed on the base substrate, a first gate insulating layer is formed on a side of the active layer away from the base substrate, the gate electrode and the first capacitor plate are formed in a same layer and on a side of the first gate insulating layer away from the base substrate, a second gate insulating layer is formed on a side of the gate electrode and the first capacitor plate away from the base substrate, the second capacitor plate is formed on a side of the second gate insulating layer away from the base substrate, an interlayer insulating layer is formed on a side of the second capacitor plate away from the base substrate, the source and drain electrodes are formed on a side of the interlayer insulating layer away from the base substrate, and are electrically connected with the active layer through vias passing through the first gate insulating layer, the second gate insulating layer, and the interlayer insulating layer, and a planarization layer is formed on a side of the source and drain electrodes away from the base substrate;

the forming the first display region further comprises:
    forming a transparent support layer between the base substrate and the first light-emitting device, wherein the transparent support layer is formed in a same layer as at least one of the first gate insulating layer, the second gate insulating layer, the interlayer insulating layer, and the planarization layer.

* * * * *